(12) United States Patent
Mangano

(10) Patent No.: US 7,573,688 B2
(45) Date of Patent: Aug. 11, 2009

(54) METHODS AND SYSTEMS FOR HIGH CURRENT SEMICONDUCTOR DIODE JUNCTION PROTECTION

(75) Inventor: Joseph Mangano, Arlington, VA (US)

(73) Assignee: Science Research Laboratory, Inc., Somerville, MA (US)

(*) Notice: Subject to any disclaimer, the term of this patent is extended or adjusted under 35 U.S.C. 154(b) by 626 days.

(21) Appl. No.: 10/922,753

(22) Filed: Aug. 20, 2004

(65) Prior Publication Data
US 2007/0273432 A1    Nov. 29, 2007

Related U.S. Application Data

(63) Continuation-in-part of application No. 10/165,195, filed on Jun. 7, 2002, now Pat. No. 6,798,797.

(60) Provisional application No. 60/544,646, filed on Feb. 13, 2004.

(51) Int. Cl.
*H02H 7/00* (2006.01)

(52) U.S. Cl. ...................................................... 361/79
(58) Field of Classification Search .................. 361/79, 361/56
See application file for complete search history.

(56) References Cited

U.S. PATENT DOCUMENTS

| 3,997,849 | A |   | 12/1976 | Thommen ..................... 330/13 |
| 4,158,178 | A | * | 6/1979  | Schade, Jr. .................. 330/253 |
| 4,325,018 | A | * | 4/1982  | Schade, Jr. .................. 323/313 |
| 4,415,815 | A |   | 11/1983 | Dijkmans et al. ........... 307/243 |
| 4,774,510 | A | * | 9/1988  | Steinke ....................... 340/3.42 |
| 4,843,610 | A | * | 6/1989  | Okada et al. .................. 372/31 |
| 5,287,367 | A |   | 2/1994  | Yanagawa ..................... 372/31 |
| 5,467,242 | A | * | 11/1995 | Kiraly .......................... 361/94 |
| 5,604,758 | A |   | 2/1997  | AuYeung et al. .............. 372/34 |

(Continued)

OTHER PUBLICATIONS

G. Beister et al. Method for Observation of Facet Degradation and Stabilization in InGaAs-QW/GaAs//AlGaAs Laser Diodes, available at http://www.fbh-berlin.de/jb_96/jb52.pdf, pp. 99-101.

(Continued)

*Primary Examiner*—Stephen W Jackson
(74) *Attorney, Agent, or Firm*—Burns & Levinson LLP; Orlando Lopez

(57) ABSTRACT

Protection methods and protection systems, for high current semiconductor devices with diode junctions, that detect the anomalies in the local temperature at small areas of the junction and protect the device from accelerated aging and premature catastrophic damage.

In an embodiment of the method of this invention for protecting a high current semiconductor devices with diode junctions, anomalies in the electrical or optical behavior of the junction are detected and, upon detection of the anomalies, power is diverted away from or around the device.

31 Claims, 22 Drawing Sheets

U.S. PATENT DOCUMENTS

| | | | | |
|---|---|---|---|---|
| 5,654,560 | A | * | 8/1997 | Nishizawa et al. ........... 257/139 |
| 5,812,580 | A | | 9/1998 | Nabiev et al. .................. 372/49 |
| 5,818,857 | A | | 10/1998 | Palmer ........................ 372/32 |
| 5,966,394 | A | | 10/1999 | Spurr et al. ................... 372/34 |
| 6,229,833 | B1 | | 5/2001 | Noda et al. ............... 372/38.09 |
| 6,236,087 | B1 | * | 5/2001 | Daly et al. ................... 257/355 |
| 6,798,797 | B2 | * | 9/2004 | Mangano et al. ......... 372/29.01 |
| 2002/0190666 | A1 | | 12/2002 | Sakamoto et al. ........... 315/291 |
| 2003/0039280 | A1 | | 2/2003 | Mangano et al. ......... 372/38.02 |
| 2003/0048820 | A1 | | 3/2003 | Fischer .................... 372/38.02 |
| 2003/0058906 | A1 | | 3/2003 | Finn et al. ..................... 372/34 |
| 2003/0091077 | A1 | | 5/2003 | Fischer .................... 372/38.02 |
| 2003/0152390 | A1 | | 8/2003 | Stewart et al. .............. 398/135 |

OTHER PUBLICATIONS

U.S. Appl. No. 60/544,646, entitled Methods and Systems for High Current Semiconductor Diode Junction Fault Protection, filed on Feb. 13, 2004.

\* cited by examiner $\Delta T := 0, 1 .. 200$ $\Delta \lambda(t) := 0.25 \cdot \Delta T$

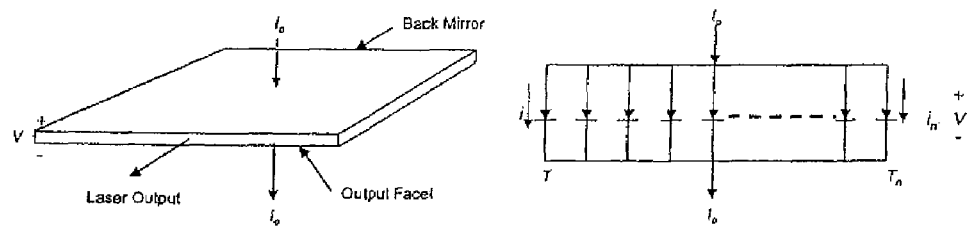

Figure A1. Schematic view of the laser diode model. The active region of the laser diode is modeled electrically and thermally as a 1-dimensional, N-element array of lumped elements driven by a constant current source $I_o$. Filamentation is observed by shifting of current from N-1 elements having current $i(t)$ and temperature $T(t)$, to element N, having current $i_N(t)$ and temperature $T_N(T)$.

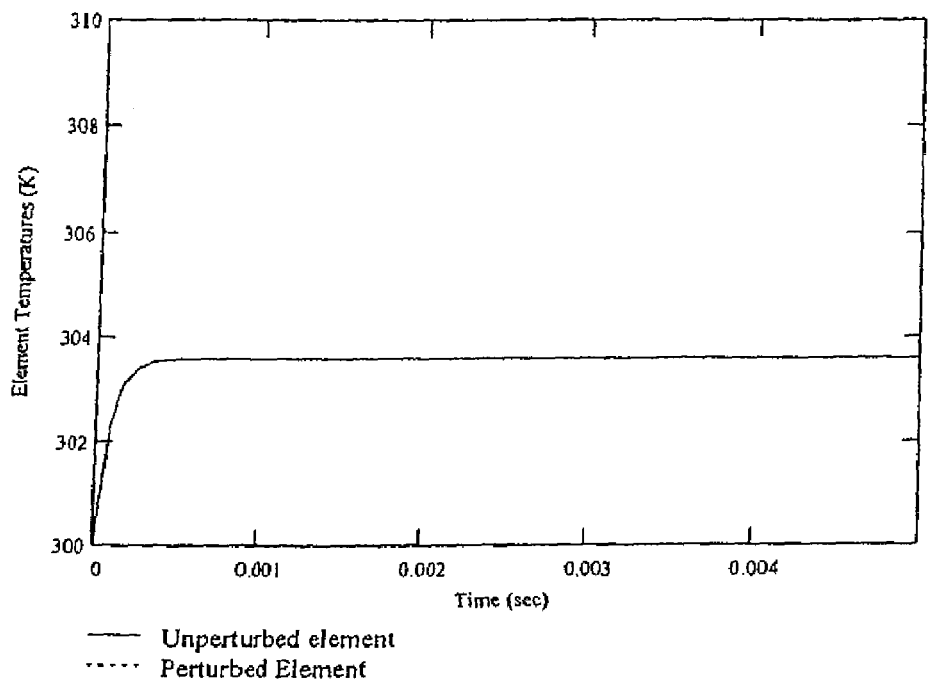
Fig. A2a
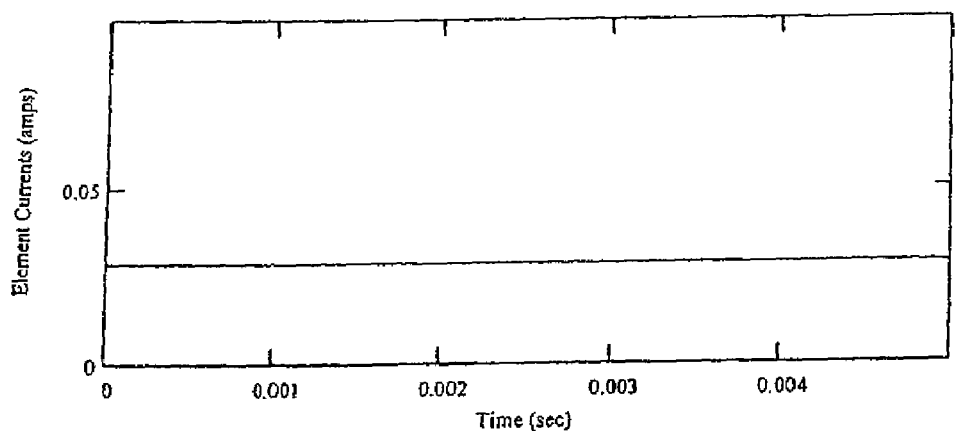
Fig. A2b

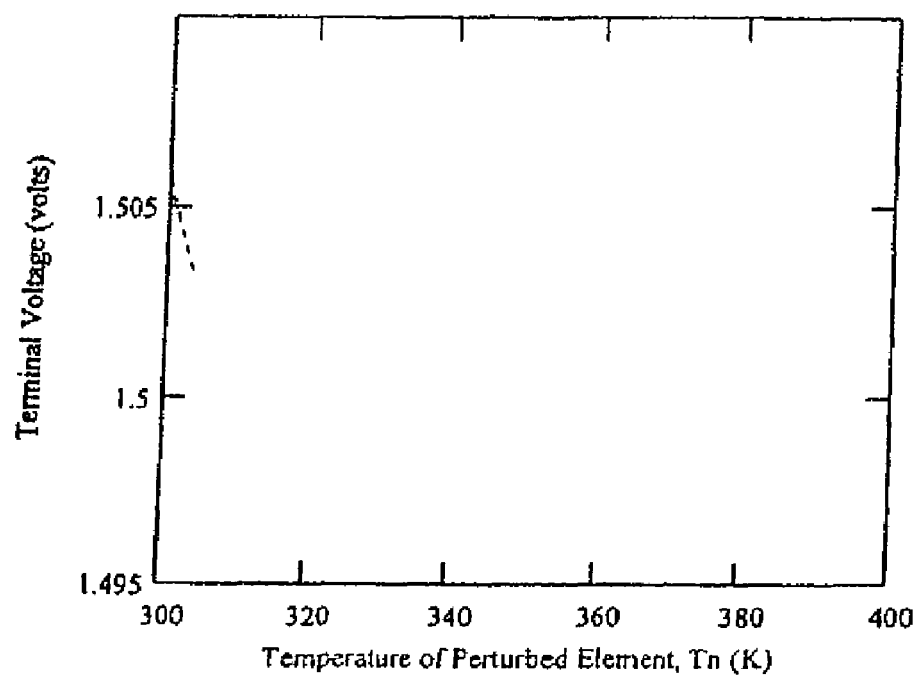
Fig. A2c

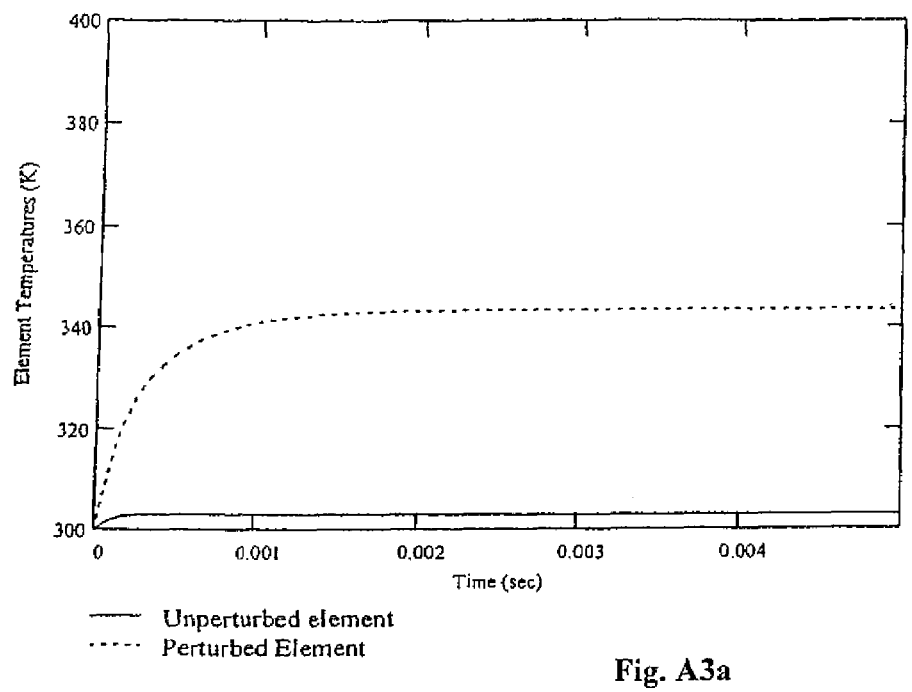
Fig. A3a
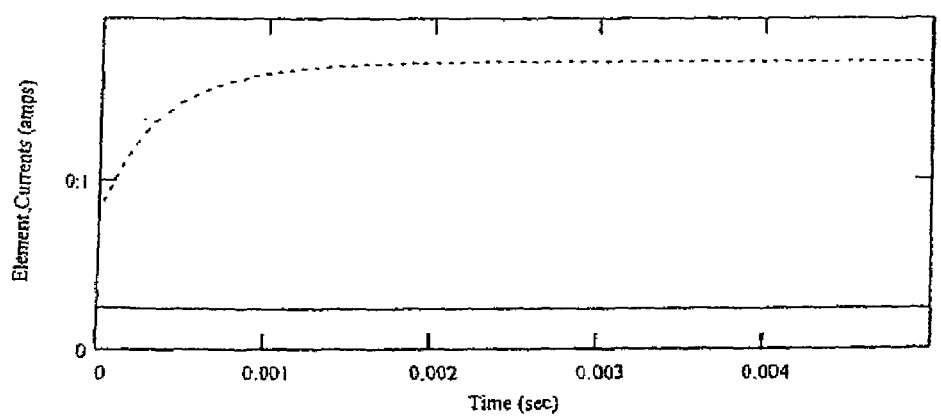
Fig. A3b

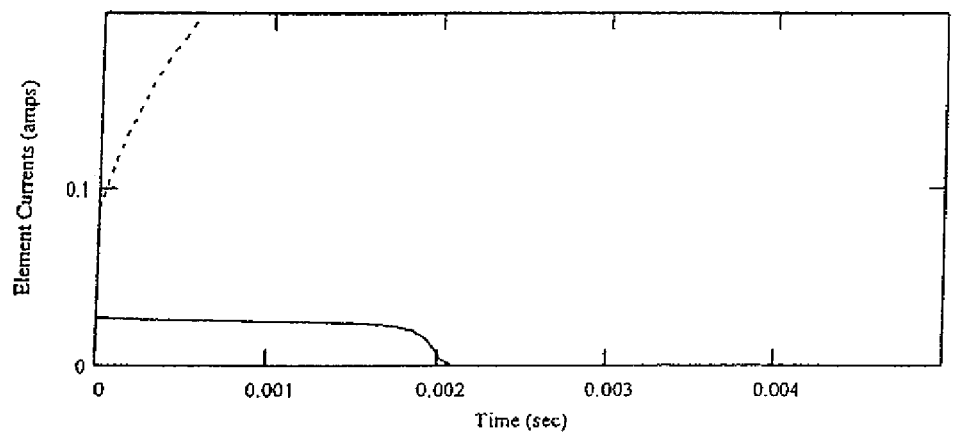
Fig. A4c
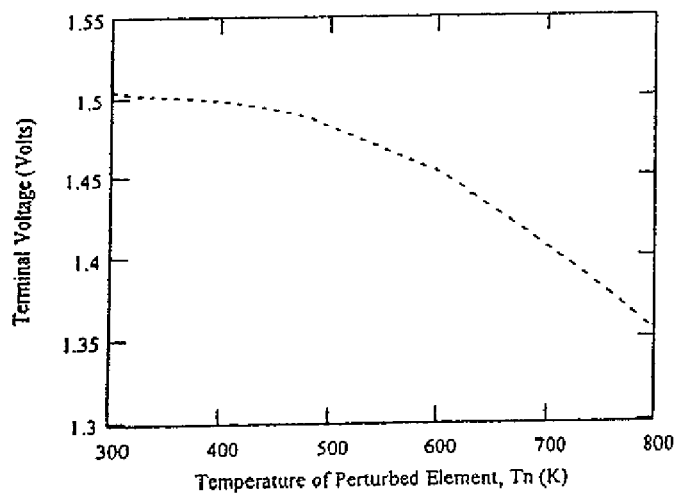
Fig. A4d

METHODS AND SYSTEMS FOR HIGH CURRENT SEMICONDUCTOR DIODE JUNCTION PROTECTION

CROSS REFERENCE TO RELATED APPLICATIONS

This application is a continuation-in-part of U.S. application Ser. No. 10/165,195 filed Jun. 7, 2002 now U.S. Pat. No. 6,798,797 entitled METHODS AND APPARATUS FOR DRIVING LASER DIODE SOURCES, which is incorporated by reference herein, and claims priority of U.S. Provisional Patent application Ser. No. 60/544,646, entitled METHODS AND SYSTEMS FOR HIGH CURRENT SEMICONDUCTOR DIODE JUNCTION FAULT PROTECTION, filed on Feb. 13, 2004, which is also incorporated by reference herein.

FIELD OF THE INVENTION

The present invention relates to high current semiconductor devices with diode junctions (such as laser diodes), and more particularly to methods and systems for junction protection.

BACKGROUND OF THE INVENTION

A semiconductor laser (laser diode) transforms electrical energy into optical energy with relatively high efficiency. A laser diode is typically includes a layer of p-type semiconductor material adjacent to a layer of n-type semiconductor material (referred to as a p-n junction). When electrical current passes from the p-type layer to the n-type layer, stimulated emission of optical radiation results in the active layer. In practice, the stimulated emission is limited to only a portion (the active region) of the active layer. The opposing end faces of the active region are called the facets, which are cleaved and/or etched to define a laser cavity between the two facets. A highly reflective dielectric coating is usually deposited on one facet (the non-output facet), and a semi-reflective dielectric coating on the other facet (the output coupling facet). The optical energy generated by the electric current oscillates between the output facet and the non-output facet, and is partially transmitted by the semi-reflective coating at the output facet to produce a diode laser output beam.

Laser diode bars are constructed from a linear array of such individual laser diodes, with all the diodes typically driven in parallel from two highly conducting electrodes. Stacks of these bars can then be driven in series to form a laser diode array, which is a two dimensional array of individual diodes.

Diode junction aging, associated degradation, and catastrophic failure are serious problems in laser diodes. Specifically, a key failure mode of laser diodes is catastrophic optical damage (COD), which occurs suddenly after more gradual diode aging in which the performance of the diode degrades slowly with time. Gradual aging is a result of localized junction overheating caused by filamentation of the diode current and of the output optical beam. Initially, current and optical filamentation of the diode current is caused by local variations in the electrical and optical properties along the diode junction. For example, variations in electric field along the junction result in local current variations and also in local optical laser beam intensity variations along the diode output. These variations in electric field and associated current density variations also lead to temperature variations along the junction. Small changes in the local electric field (2% relative to the average electric field across in the junction), for example, can lead to large changes in the local current density (relative to the average current density in the junction) and temperature, and therefore large changes locally in the intensity of the optical laser beam. Gradual aging, resulting from these current density and temperature variations, culminates in catastrophic optical damage (COD) and/or catastrophic optical mirror damage (COMD). COD and COMD are caused by an instability which rapidly leads to catastrophic overheating and results in the failure of that portion of the diode junction. COD and COMD result from destructive overheating of the junction material and/or the diode facet or coating material.

Multiple modes of laser diode failure arise from filamentation of the drive current to the diode or the diode bar, or filamentation of the optical beam within the laser active medium (the active portion of the p-n junction). These modes can range from overheating and destruction of the output facet, migration of dopants, and junction punch through.

In laser diodes, high current density must be provided in order to reach lasing threshold, and even higher current densities are needed to reach optimum laser output efficiency, laser power, and laser brightness. However, even if the laser is driven by a so-called constant current source, the current can filament in a region or regions of the active junction resulting in some sections of the junction experiencing higher current density than others. With a constant current source, these regions of higher current density have lower impedance to current flow than surrounding regions which experience lower current density than average. It is the sections of the junction experiencing higher current density that have higher temperature, age more rapidly, and are prone to unstable filamentation instabilities. In cases where the current is filamented in the diode, due for example to variations of electric field across the junction, the total current in the diode must be adjusted so that the sections of higher current density do not result in unacceptably rapid aging. However, accommodating these regions of higher current density in this manner reduces the efficiency and intensity in sections of lower current density, and therefore the overall efficiency and power of the diode is ultimately compromised. Since the bandgap of the semiconductor material changes with temperature, filamentation also leads to shifts and spreads of the output spectrum of the laser diode. These shifts and spreads in the output spectrum can reduce the efficiency of coupling to the pump bands of solid state laser media pumped by these laser diodes. Efficiency is defined as optical power output divided by electrical power input.

Initially, electric field variations and resulting current filamentation can lead to large, but stable changes in the local diode junction temperature and in the intensity of the output laser beam. Later, as these stable current, temperature, and optical intensity variations age the diode junction, the filamentation can become unstable, and the larger unstable current, temperature, and intensity changes in the region can lead to COD and/or COMD.

Controlling the current density in the junctions of laser diodes, laser diode bars (LDBs) and laser diode arrays (LDAs) is complicated by the fact that the junction bandgap decreases with increasing temperature. In junction regions having higher perturbed electric fields, the current density is higher. In these sections of the laser diode junction with higher current density, the temperature is higher and the bandgap is lower. When the bandgap shrinks, the current density in this section can increase even more at the expense of the current density in adjacent sections (even with a so-called constant current source powering the diode). The increased current density in this section then increases the temperature locally even further, and the bandgap shrinks even further.

This instability can continue until the current density and temperature in this section is sufficiently high to cause cumulative incremental damage (aging) and ultimately catastrophic damage (COD and/or COMD). These instabilities can be driven by small variations in electric field across the junction, which can be caused by local changes in the junction material properties or by edge effects at the periphery of the junction. These initial variations can also be caused by crystal defects. The positive feedback process starting with increased current density in regions of higher electric field, leads to locally higher temperature, locally reduced bandgap, and then to even higher local current density. This positive feedback results in rapid thermal runaway, and breakdown locally of the p-n junction. This thermal runaway in the region of current filaments creating "hot spots" is referred to as a current filamentation instability As detailed above, high current operation of a semiconductor junction can lead to filamentation instabilities which constrict the current flow through the junction. Filamentation increases the current density and the temperature of the junction locally (where the current is flowing). Because the bandgap for these semiconductor junctions typically decreases as temperature rises, the locally increased junction temperature leads in some cases to even higher current density in that local region. The local increase in current density is not necessarily accompanied by an increase in total current to the device. This feedback mechanism leads to an instability in which the temperature of a section or sections of the junction continue to rise until damage is done to the semiconducting junction or to adjacent structures.

Restricting the total current to the semiconducting junction with so-called current regulation circuits or constant current drive circuits does not prevent filamentation instabilities or their consequences, which include thermal runaway, accelerated aging, and ultimately device failure. Even if the total current to the terminals of the device were held constant, device current can constrict in a local region or regions of the semiconducting junction so that excessive heat is deposited locally in a limited region or regions of the junction. Such localized junction heating along only a portion of the junction leads to local thermal runaway, accelerated device aging and ultimately premature device failure.

Measuring or sensing the external temperature of the device and then interrupting the current to the device when a temperature anomaly is sensed may not be effective in preventing these instabilities and their consequences (thermal runaway, accelerated device aging, and ultimately premature device failure). When current filamentation instabilities occur, the external temperature of the device may rise, fall, or stay the same. So measuring the temperature of the outer surface of the device (the device case) with a temperature sensing device is not necessarily an indicator of these instabilities. Temperatures of interest in catastrophic optical damage of the laser facet are the local temperatures caused by excessive absorption of the optical power at small regions of the junction. Temperatures of interest in catastrophic damage to the junction itself are in the active region of the junction which is a thin layer region (0.1 to 1.0 microns sandwiched between thick layers (50-100 microns) of semiconductor material. Temperature anomalies in local regions of the semiconductor junction take time to diffuse to the device surface. This lag time may be many microseconds or milliseconds. Device damage can occur during this lag time.

In laser diode devices, these current filamentation instabilities can be exacerbated by the nonlinear interaction of the laser beam with the laser gain medium. These Kerr-type instabilities can lead to self-focusing of the laser light within the laser device. This instability can interact with the current instability described above, damaging the diode facets and leading to so-called catastrophic optical damage (COD) and catastrophic optical mirror damage (COMD).

In some high current semiconductor devices with diode junctions, device function is not the production of light, but to simply switch a voltage or current or to otherwise regulate a voltage or current. These devices are also subject to the current filamentation instability described above. Current instabilities in these devices also lead to thermal runaway, accelerated device aging, and ultimately device failure. High current semiconductor switch manufacturers already use special techniques to mitigate the effects of such current filamentation. Since current density need not necessarily be made high in these devices, high current semiconductor switches sometimes employ geometrical methods for spreading the current in the junction of these devices by using spider-shaped electrode structures and other current spreading geometries and techniques to divide the device current before it is injected into the semiconducting medium. It must be noted that many of the instability mitigation techniques used presently in these semiconductor switch devices cannot be used in geometries required by laser diodes, light emitting diodes and VCSELs where the current density must reach a certain minimum value to reach threshold lasing and then an even higher current density value to optimize laser output, efficiency, and brightness.

Spreading and limiting the current in laser diodes and light emitting diodes using resistive layers before the current enters the semiconducting media has also been attempted. However, the series resistance needed in these layers lead to power dissipation and unacceptable reductions in the overall electrical efficiency of these light sources. In addition, these resistive ballasting techniques ultimately cannot prevent current filamentation in the active junction region which is a thin layer sandwiched in a much thicker semiconducting medium.

Laser diodes, light emitting diodes, and VCSELs are sometimes arranged in bars or arrays. For bars in which multiple devices are driven in parallel, the same type of fault mode mitigation and protection circuitry used for a single device can be effective in suppressing and protecting against instabilities. In a laser diode bar, all of the laser diodes are driven in parallel from the same current node. Physically this current node is typically fabricated from a material with high electrical conductivity and high thermal conductivity such as copper. These current nodes also serve a second function which is to cool the individual diodes by transporting waste heat generated in the diode to a heat sink.

Current instabilities similar to those which occur in single diodes can also occur in laser diode bars. In addition to filamentation within individual diodes in the bar, this instability also causes current hogging, in which the current to the common node for all the diodes in the bar is not shared equally among the diodes in the bar. The diodes that hog more current than the average current (average current=total current to the node/the number of diodes in the bar) are prone to overheating and thermal runaway. Note that such an instability is not prevented by using current regulating circuitry or so-called constant current sources to power the laser diode bar. Although laser diodes were used here as an example, other devices containing semiconducting junctions such as light emitting diodes and VCSELs are also sometimes arranged in parallel in bars, and the same descriptions and conclusions apply to them as well.

Note that current sharing in laser diode bars can be enforced by using separate resistors in series with each diode in the bar. However, true current sharing requires that the value of the series resistance be approximately as large as the effective resistance of the laser diode, so that the electrical efficiency of such a bar would be reduced by a factor of 2 or more.

For arrays of these devices driven in series, current hogging is not an issue, since the same total current must pass through each device. However, current filamentation instabilities within each of these devices can still occur with the consequences that have been discussed above.

The concept of driving the individual diodes making up bars in series rather than in parallel may have beneficial effects since current hogging is not allowed and current sharing is imposed in a series configuration. As discussed above, laser diode bars are now driven in parallel for convenience. It is easier to cool these devices from a common, high thermal conductivity, electrode structure—the highly conducting node described above. However, high thermal conductivity, low electrical conductivity materials such as beryllium oxide and diamond can be used as electrical insulators. With these materials to remove heat from the individual diodes, it is possible to contemplate rearranging diode bars into a series configuration. Such a configuration would ensure that the current through each device in the bar is equal, thereby removing the possibility of current hogging. Such configurations however do not remove the possibility of filamentation.

There is a need for protection methods and protection systems for high current semiconductor junction devices that detect the filamentation instabilities and anomalies in junction behavior and protect the device from catastrophic damage.

BRIEF SUMMARY OF THE INVENTION

Protection methods and protection systems, for high current semiconductor devices with diode junctions, that detect the anomalies, such as, but not limited to, current non-uniformities and instabilities (filamentation), in the junction behavior, and protect the device from accelerated aging and premature catastrophic damage are disclosed.

In an embodiment of the method of this invention for protecting a high current semiconductor device with diode junctions, anomalies, such as, but not limited to, current non-uniformities and instabilities (filamentation) and their effect on optical behavior, in the electrical or optical behavior of the junction are detected and, upon detection of the anomalies, power is diverted away from or around the device. In one embodiment, the anomalies are detected by monitoring a relationship between the time-varying device voltage, V(t), and the time-varying device current, I(t). In another embodiment, the anomalies are detected by monitoring the device voltage, V(t), at a substantially fixed current. (In the above and hereinafter, the device voltage is a predetermined voltage such as, but not limited to, the terminal voltage or the junction voltage for the device,)

In yet another embodiment, the anomalies are detected by optically sensing a fraction of the laser diode output and detecting the shift to longer wavelengths of the laser diode output.

In still another embodiment of the method of this invention for protecting a high current semiconductor devices with diode junctions, current filamentation (within individual devices such as diodes) and current hogging instabilities (in parallel-connected diodes (bars)) are suppressed using a predetermined micropulse format.

The embodiments of the systems of this invention implement the methods of this invention. In still another embodiment of the systems of this invention, the pulsed and DC laser diode wave forms are replaced by preselected pulse wave forms that take into account the time for the development of anomalies.

For a better understanding of the present invention, together with other and further objects thereof, reference is made to the accompanying drawings and detailed description and its scope will be pointed out in the appended claims.

BRIEF DESCRIPTION OF THE DRAWINGS

FIG. 6b is a schematic block diagram representation of a detailed embodiment of the system of FIG. 6a;

FIG. A1 is a schematic representation of a semiconductor junction device model used in appendix A;

FIG. A2a is a schematic graphical representation of temperature variation obtained from one exemplary solution of the model described in appendix A;

FIG. A2b is a schematic graphical representation of current variation obtained from one exemplary solution of the model described in appendix A;

FIG. A2c is a schematic graphical representation of voltage variation obtained from one exemplary solution of the model described in appendix A FIG. A3a is a schematic graphical representation of temperature variation obtained from another exemplary solution of the model described in appendix A FIG. A3b is a schematic graphical representation of current variation obtained from another exemplary solution of the model described in appendix A FIG. A4c is a schematic graphical representation of current variation obtained from yet another exemplary solution of the model described in appendix A;

FIG. A4d is a schematic graphical representation of voltage variation obtained from yet another exemplary solution of the model described in appendix A.

DETAILED DESCRIPTION OF THE PREFERRED EMBODIMENTS

Protection methods and protection systems for high current semiconductor devices with diode junctions that detect the anomalous behavior, such as, but not limited to, non uniformities and instabilities (filamentation), in the local current density and temperature at small areas of the junction and actively protects the high current semiconductor devices with diode junctions from accelerated aging and premature catastrophic damage are disclosed hereinbelow.

While in the embodiments presented below are described in terms of laser diodes, it should be noted that the embodiments could be utilized for other high current semiconductor devices with diode junctions.

Figure 1A:
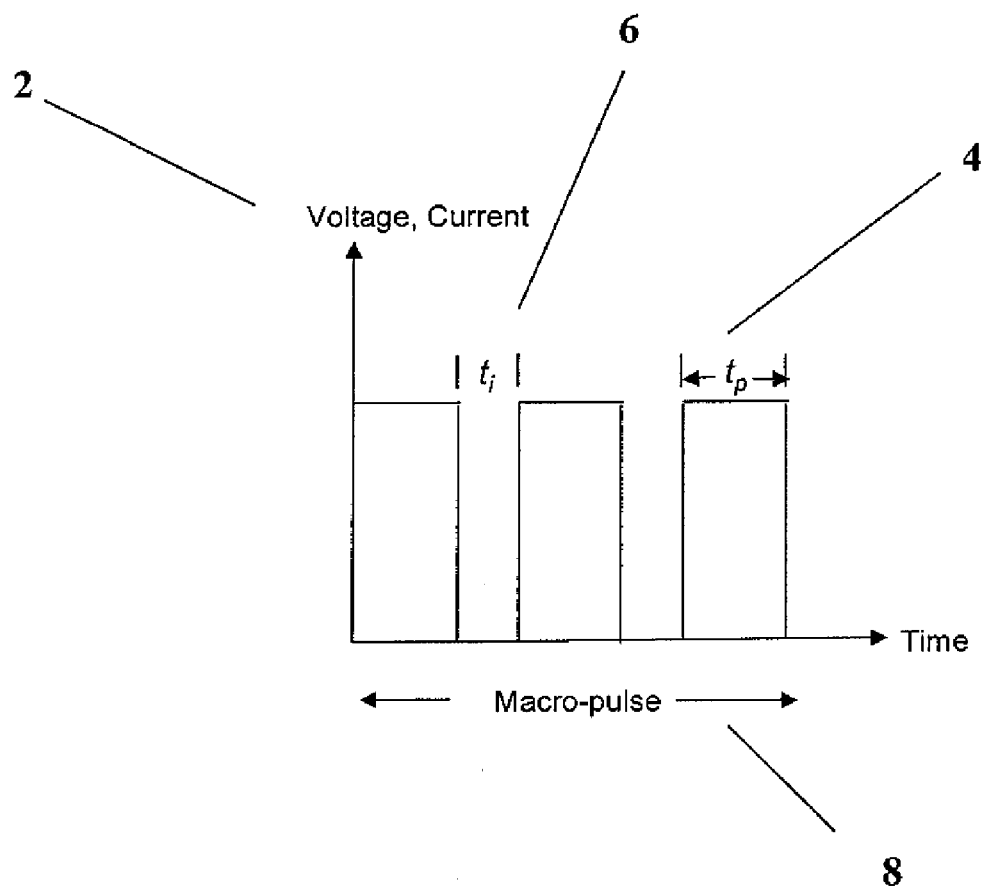
FIG. 1a is a schematic representation of a pulse waveform utilized in an embodiment of the system of this invention.

In an embodiment of this invention, current filamentation (within individual diodes) and current hogging instabilities (in parallel-connected diodes (bars)) are suppressed using a predetermined pulse waveform. In the predetermined pulsed waveform 2, shown in FIG. 1a, the current is turned on for a time duration $t_{on}$ (4, FIG. 1a) which is selected to be shorter than the onset time for the fastest growing filamentation instability for the particular diode type and operating point selected. The diode is then turned off for a time $t_{off}$ (6, FIG. 1a) which is longer than the time required for the diode to recover to its ambient state before onset of the instability. That is, $t_{off}$ is made longer than the time it takes for any spatial non-uniformities in junction current or temperature to dissipate. Thus, $t_{off}$ is selected to be long enough that the temperature of the diode has returned to its original temperature prior to application of the current drive pulse, or to a lower temperature.

The length of the micropulse burst (the macropulse) (8, FIG. 1a) is selected based on the application. In applications requiring pulsed operation with pulse duration $t_p$, this single pulse would be replaced with multiple micropulses having total duration $t_p$ (the macropulse length) (8, FIG. 1a). In applications where continuous operation for an extended time is required, the micropulse drive waveform would be used over the entire duration of this extended time.

For the micropulse waveform, in one embodiment, although it should be noted that other embodiments are possible, $t_{on}$ will be in the range greater than 100 microseconds, while the $t_{off}$ will be in the range of the thermal time constant for heat removal from the active junction region. In another embodiment, the optimum values for $t_{on}$ and $t_{off}$ are predetermined for each device type.

For each device type, the device drive current during $t_{on}$ can be approximately the same as the device drive current that was used before the invention of this specialized micropulse waveform. In this manner, it is anticipated that the average output power of the device will be nearly as large or larger with the micropulse waveform as without.

For the current filamentation instability, an estimate of the instability growth rate can be made in terms of diode materials, geometries and other properties. Growth rates for the Kerr-type instability have also been calculated and are reported in the published scientific literature.

Equations describing the current filamentation instability, which is driven by variations in the electric field across the junction and depend on the decrease in junction bandgap with increasing junction temperature, are provided in Appendix A in order to illustrate an instability that can lead to filamentation in high current semiconductor devices with diode junctions.

Figure 1B:
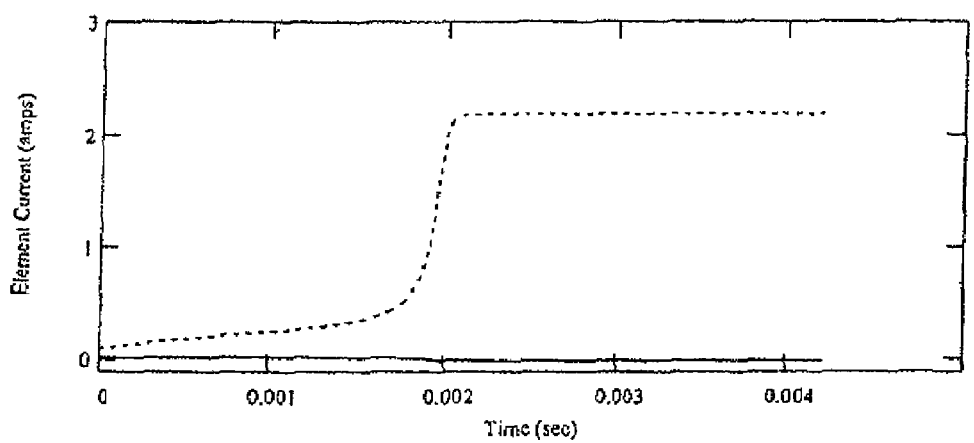
FIG. 1b is a schematic graphical representation of results of a calculation of device current showing the effects of a filamentation instability.
Figure 1C:
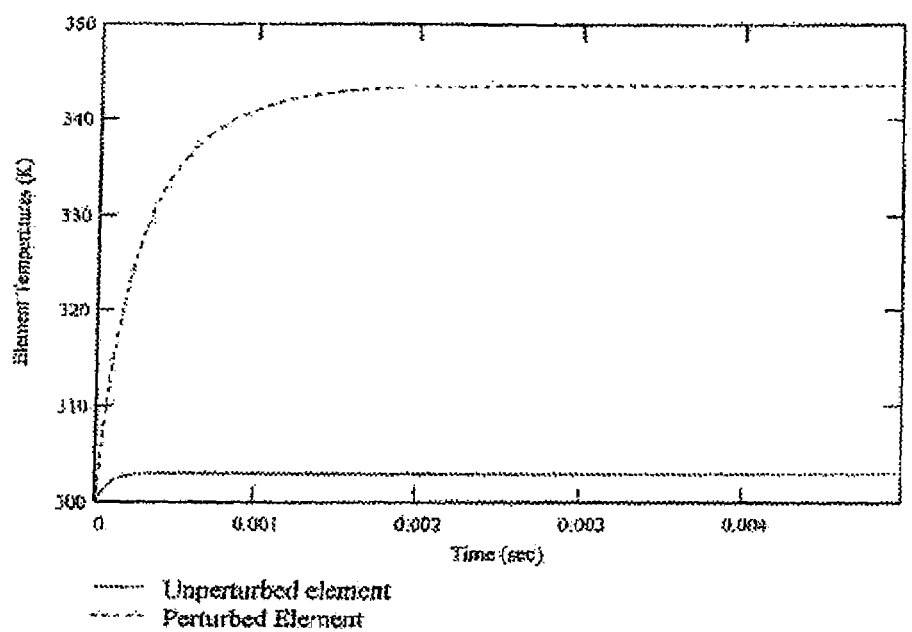
FIG. 1c is a schematic graphical representation of results of a calculation of junction temperature showing the effects of a filamentation instability.

FIG. 1b (obtained from FIG. A5) indicates that the instability has a finite growth rate in time, and that there is an approximate onset time for the instability to emerge temporally. The onset time, which can be obtained from the current and temperature plots in FIGS. 1b and 1c, can be used to select approximately the on-time for the micropulse waveform shown in FIG. 1. In one embodiment, a few (n) thermal time constants, nτ, can be selected as the appropriate off time for the micropulse waveform shown in FIG. 1a.

The calculations provided in Appendix A can be used to illustrate how the parameters of the micropulse waveform are selected. In obtaining FIGS. 1b and 1c (obtained utilizing the methods described in Appendix A), the initial temperature of the perturbed N+1$^{st}$ element (as defined in Appendix A), Tno, is set equal to 305° K. The total diode terminal current is set equal to 2200 mA, and the electric field enhancement factor is set equal to 1.02. Under these conditions, operation of the diode is unstable, and the temperature and current of the perturbed element grow in time until all the current is flowing through this perturbed element. As noted in FIG. 1c, however, the temperature of the perturbed element rises slowly at first and only exceeds 400° K after 1.68 ms. So in this example, a micropulse duration, $t_{on}$, of approximately 1.68 ms or less would be used. If a lower maximum temperature excursion during the micropulse is desired, then the micropulse duration would be made shorter. Lower maximum temperature during the micropulse will reduce the rate of diode aging and delay catastrophic damage. It will also reduce the off-time that must be used in the micropulse waveform.

Figure 1D:
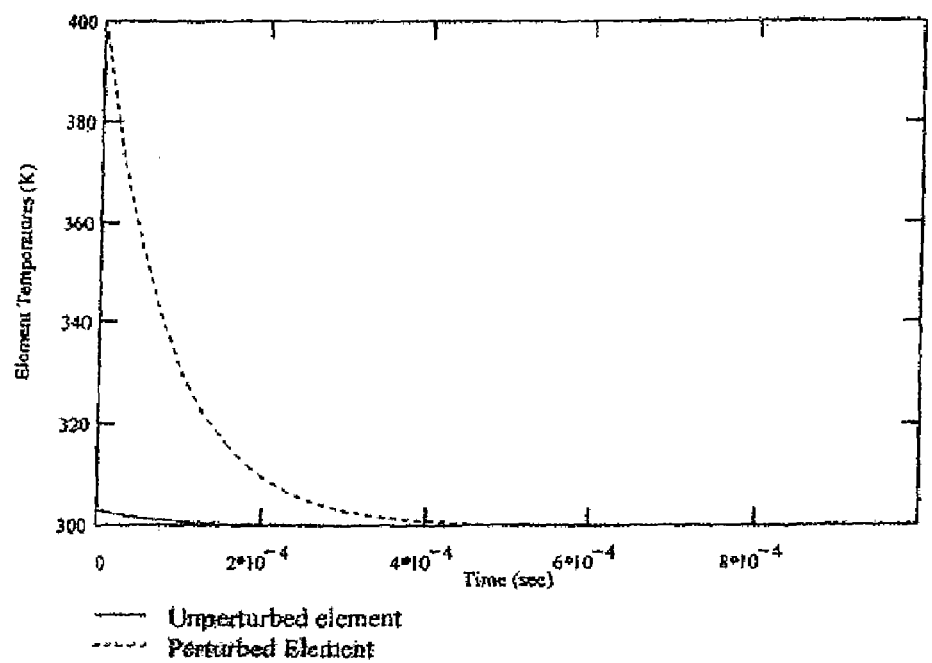
FIG. 1d is a schematic graphical representation of results of another calculation of junction temperature showing the decay of the junction temperature from 400° K after turning off an unstable micropulse.

The calculations provided in Appendix A can also to illustrate how to determined the off-time in the micropulse waveform. In one embodiment, a criterion for selecting $t_{off}$ comprises making $t_{off}$ equal to the time that it takes for the perturbed element to return to its initial temperature, Tno=305° K, or to a lower temperature, after the drive pulse to the diode is terminated. During this time, the temperature of the perturbed element will decay with a time constant that is related to thermal diffusion of heat to the heat sunk electrodes. For the conditions of the example illustrated in FIG. 1c, this thermal time constant is approximately 84 µs. This decay of the temperature of the perturbed element from its temperature of 400° K at the end of the drive pulse can be seen in FIG. 1d (obtained utilizing the methods described in Appendix A). In FIG. 1d, the drive current is set equal to 1 mA (set to 1 mA to prevent numerical instability in the differential equation solver used). The initial temperature of the perturbed element is set equal to 400° K and the initial temperature of the unperturbed element is set equal to 303° K. This is the temperature of the unperturbed element at the time when the perturbed element reaches 400° K. From FIG. 1d, the temperature of the perturbed element decays from 400° K to 305° K in approximately 252 µs. So in this example, $t_{off}$ is selected to be approximately 250 µs or more.

The duty factor for the micropulse waveform is given by $t_{on}/(t_{on}+t_{off})$. Hence in this example, the duty factor of the micropulse waveform is approximately 0.87.

Figure 2:
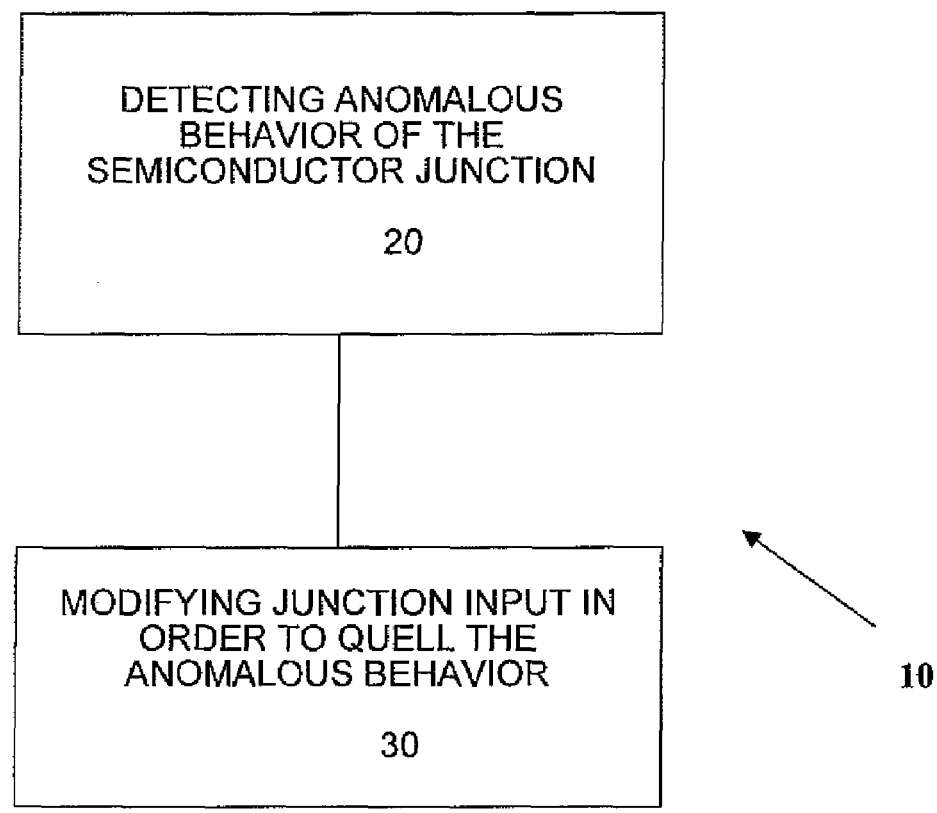
FIG. 2 is a flowchart representation of another embodiment of the method of this invention.

FIG. 2 depicts a flowchart representation 10 of one embodiment of the method of this invention. Referring to FIG. 2, non-uniformities and instabilities (filamentation) in current density and local junction temperature create anomalies (for example, but not limited to, a shift to longer wavelengths of the laser diode output, laser diode voltage variations at fixed diode terminal current, laser diode impedance variations) that can be detected (step 20, FIG. 2). Upon detection of these anomalies, power is diverted away from or around the laser diode (step 30, FIG. 2).

Figure 3A:
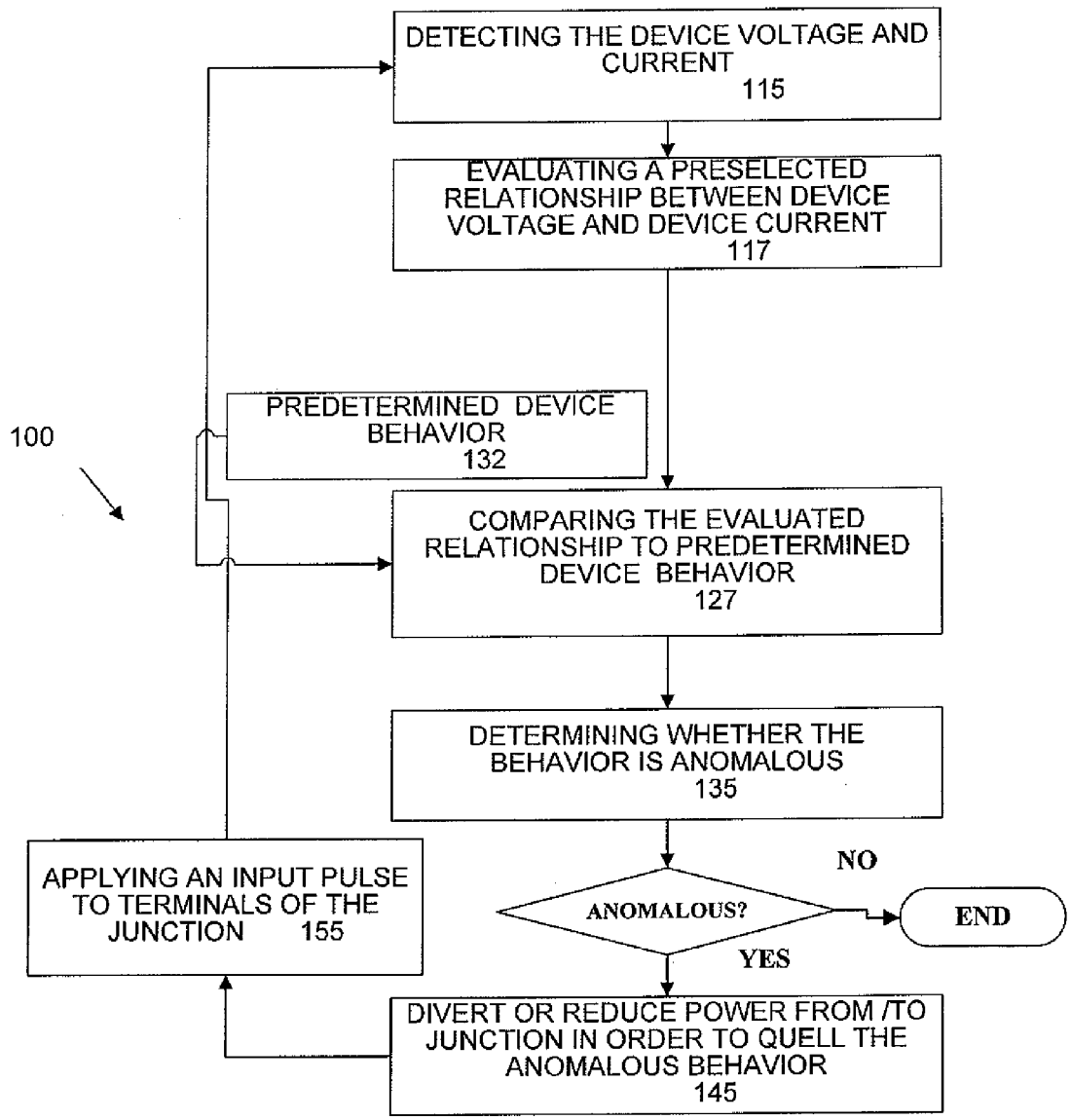
FIG. 3a is a flowchart representation of a detailed embodiment of the method of this invention.

FIG. 3a shows a flowchart representation 100 of a detailed embodiment of the method of this invention. Referring to FIG. 3a, the device voltage, V(t), and the device current, I(t) are measured (step 115, FIG. 3a). FIG. 1b and the results shown in FIGS. A2, A3, and A4 indicate that a change in the device impedance, V(t)/I(t), accompanies the onset of the instability. This change in the device impedance, V(t)/I(t), from the stable case to the unstable case can be utilized to sense the onset of the filamentation instability. In one embodiment of the invention, the relationship between the device terminal voltage and current (Step 117, FIG. 3a) and its relationship to the active junction temperature can be calibrated for each type of diode so that the diode junction temperature can be determined from measuring a relationship between the device terminal voltage and the device current such as, but not limited to, the diode terminal impedance. Filamentation is detected by comparing (step 127, FIG. 3a) a relationship between the device terminal voltage and the device current, V(t)/I(t) in one embodiment, to a predetermined value of the relationship between the device terminal voltage and the device terminal current indicating the onset of filamentation instability (step 135, FIG. 3a). It should noted that predetermined values of the relationship between the device terminal voltage and the device terminal current for the onset of instability could be generated previously from a number of previous observations. The change in the relationship between the device terminal (or junction) voltage and the device terminal current, in one embodiment the device impedance, V(t)/I(t), indicates the transition from stable to unstable operation (from unfilamented to filamented operation), and therefore is used in this embodiment in order to terminate or reduce power to the device. Upon detection of filamentation instability in the above described manner, power is diverted away from or around the laser diode or reduced (step 145, FIG. 3a). This embodiment can include the additional steps of applying a pulse to the diode terminals for a predetermined time after terminating or reducing power to the device (step 155, FIG. 3a) and repeating steps 115 through 135 in order to determine whether the diode is ready to return to stable operation. It should be noted such probing may also be used to determine how much the current or pulse duration to the device must reduced to recover quasi-stable operation during the subsequent pulses.

Figure 3B:
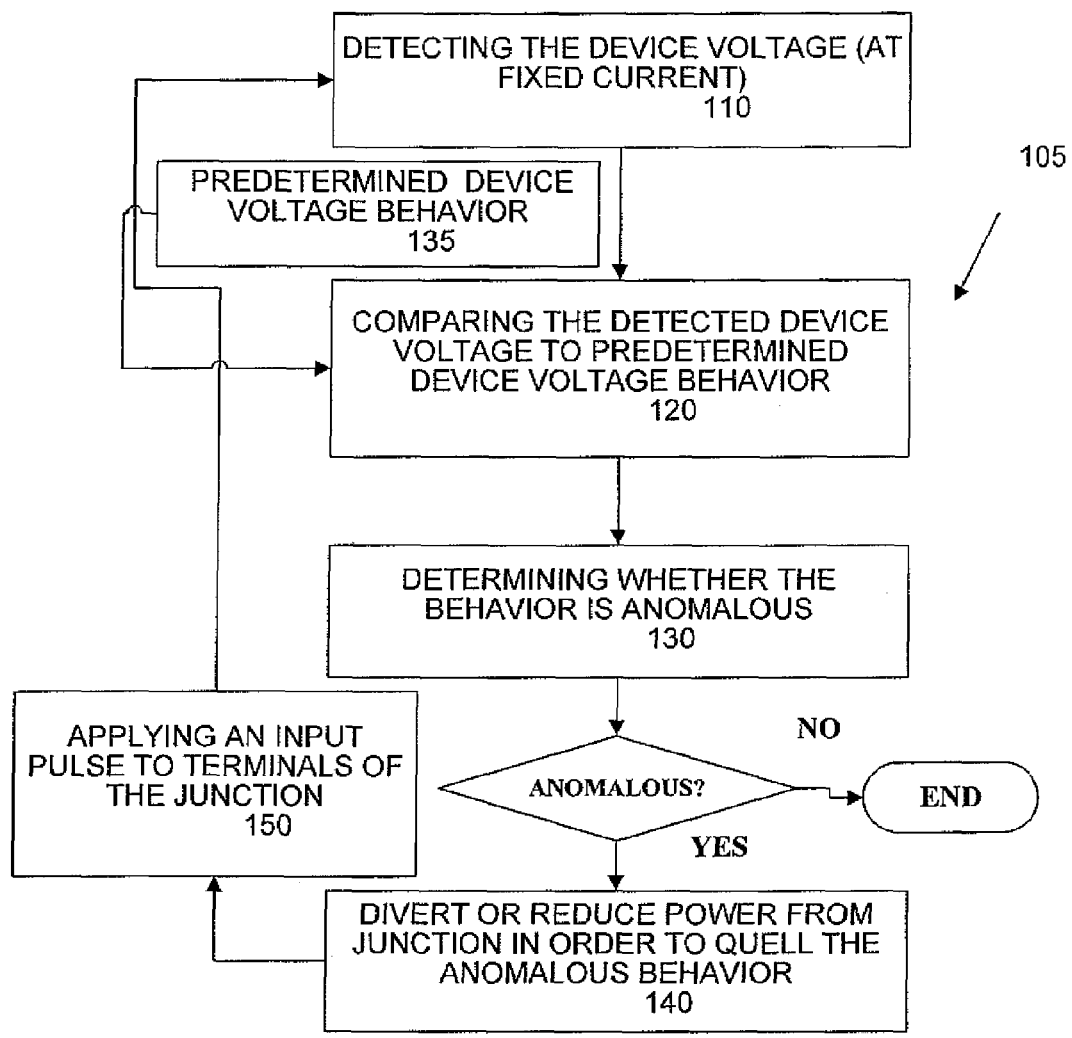
FIG. 3b is a flowchart representation of another detailed embodiment of the method of this invention.

FIG. 3b shows a flowchart representation 105 of a detailed embodiment of the method of this invention. Referring to FIG. 3b, the device voltage, V(t), is measured (step 110, FIG. 3b). The results shown in FIGS. A2, A3, and A4 indicate that, when the diode is driven with a constant current source, a shift in the device terminal (or junction) voltage, V(t), accompanies the onset of the instability. This shift in terminal voltage from the stable case to the unstable case can be utilized to sense the onset of the filamentation instability. In one embodiment of the invention, the relationship between the diode terminal voltage at the equilibrium current and its relationship to the active junction temperature can be calibrated for each type of diode so that the diode junction temperature can be determined from measuring diode terminal voltage. The anomalies are detected by comparing V(t) to a predetermined values of V(t) indicating the onset of instability (step 130, FIG. 3b). It should noted that predetermined values of V(t) for the onset of instability could be generated previously from a number of previous observations. The decrease in device terminal voltage accompanies the transition from stable to unstable operation (from unfilamented to filamented operation), and therefore is used in this embodiment in order to terminate or reduce power to the device. Upon detection of filamentation anomalies, power is diverted away from or around the laser diode or reduced (step 140, FIG. 3b). This embodiment can include the additional steps of applying a pulse to the diode terminals a predetermined time after terminating or reducing power to the device (step 150, FIG. 3b) and repeating steps 110 through 130 in order to determine whether the diode is ready to return to stable operation. It should be noted such probing may also be used to determine how much the current or pulse duration to the device must reduced to recover quasi-stable operation in pulsed operation.

One example of the analytic relationship that might exist between the change in diode terminal voltage at a preselected current and the resulting change in junction temperature is provided by the calculation in Appendix A (Equations 5-8).

The junction temperature rise typically leads to a shift in diode emission to longer wavelengths. This wavelength shift is a direct result of the decrease in photonic junction bandgap with increasing temperature. Such wavelength shifts in the diode output beam can also be used to sense the onset of filamentation, since filamentation instabilities produce regions of enhanced temperature and thus longer wavelength radiation.

Figure 4:
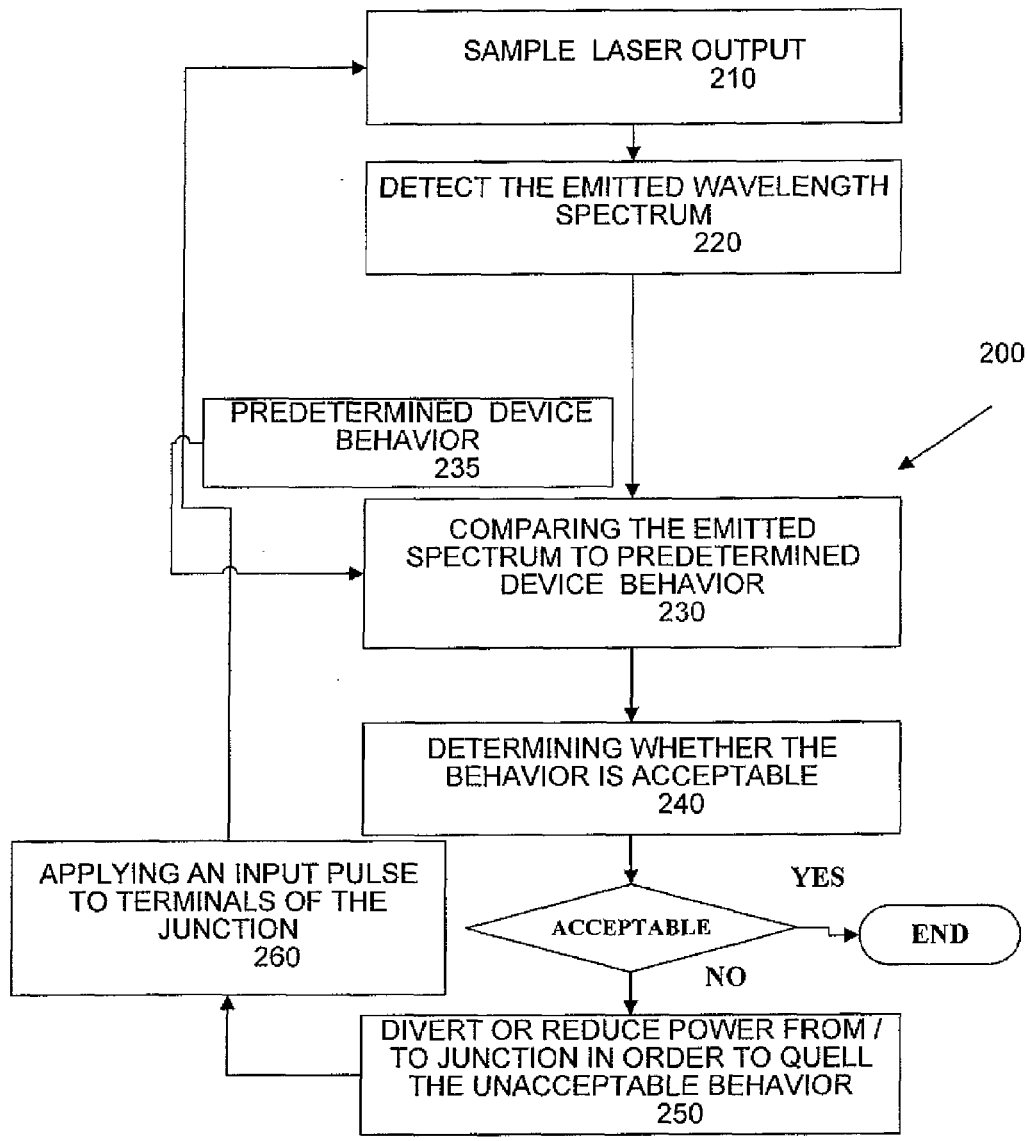
FIG. 4 is a flowchart representation of yet another detailed embodiment of the method of this invention.

FIG. 4 shows a flowchart representation 200 of another detailed embodiment of the method of this invention. Referring to FIG. 4, a small sample of the total laser diode output is obtained (step 210, FIG. 4) and the wavelengths of the laser diode output detected (step 220, FIG. 4). The wavelength is compared to behavior during substantially unfilamented operation (step 230, FIG. 4). From the comparison, filamentation and the degree of filamentation in the junction can be detected (step 240, FIG. 4). Upon detection of a predetermined unacceptable level of stable filamentation or unstable filamentation, power is diverted away from or around the laser diode or reduced (step 250, FIG. 4). This embodiment can include the additional steps of applying a pulse to the diode terminals at a predetermined time or times after terminating or reducing power to the device (step 260, FIG. 4) and repeating steps 220 and 230 in order to determine whether the diode is ready to return to stable operation (step 270, FIG. 4).

Referring again to FIG. 1, in some devices, diode aging will change the optimum values of $t_{on}$ and $t_{off}$ during the life of the diode or diode bar, and adjustments in $t_{on}$ and $t_{off}$ may have to be made adaptively during the lifetime of the diode or diode bar. Information necessary to make these adjustments can be obtained, utilizing methods similar to those described above, from the changing voltage and current characteristics of the diode or diode bar, or from the spectrally-filtered output light, as the diode or diode bar ages.

Figure 5A:
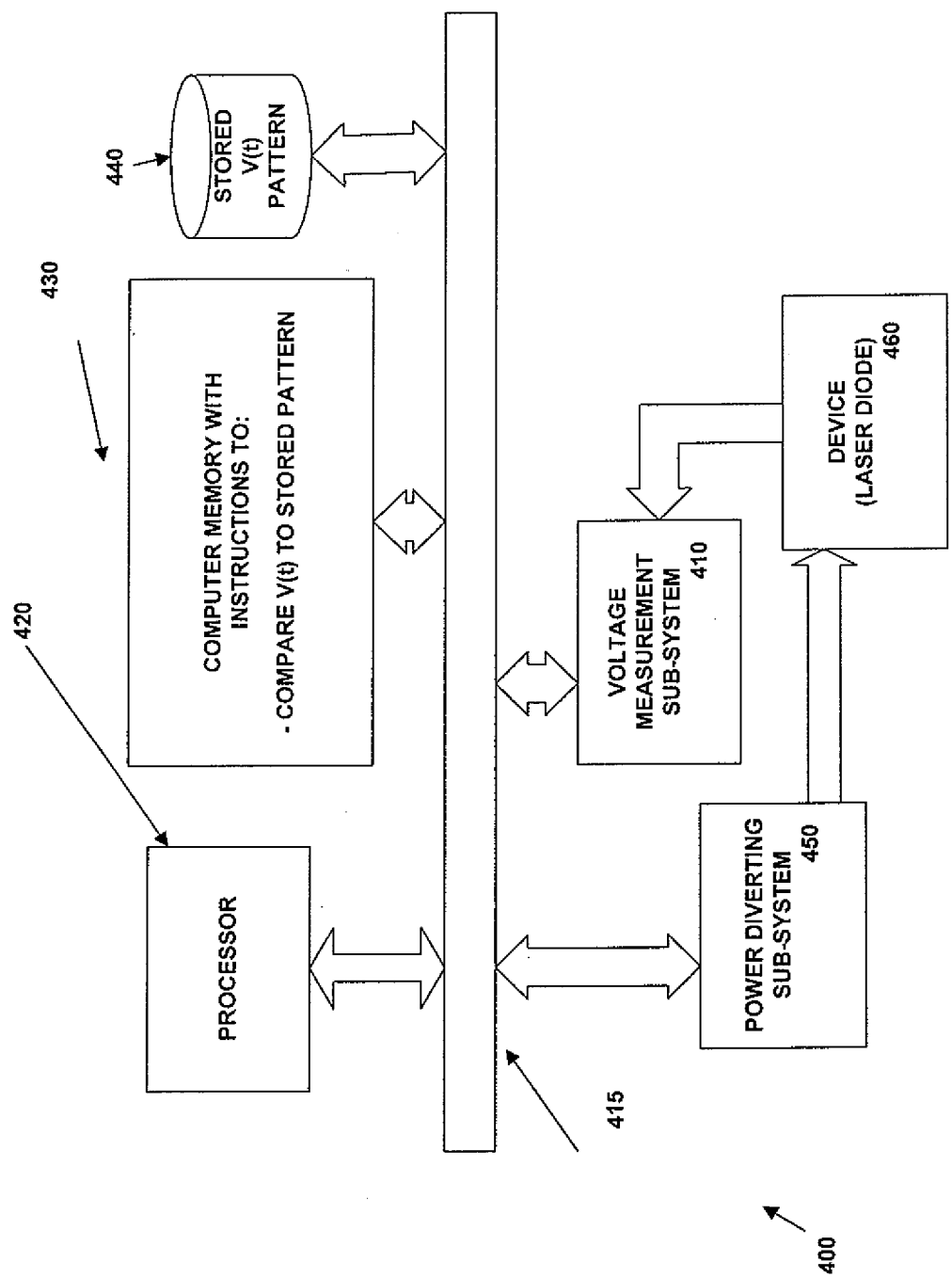
FIG. 5a is a schematic block diagram representation of one embodiment of the system of this invention.

The above described methods of this invention can be implemented by the systems of this invention. FIG. 5a shows a schematic block diagram representation of an embodiment of a system 400 of this invention. Referring to FIG. 5a, a voltage measurement system 410 provides the laser diode voltage at discrete time intervals to an operable connection 415, such as a computer bus. A computer readable memory 430 has a computer readable code embodied therein to instruct a processor 420 to compare V(t) at a substantially fixed current to the data from a stored pattern (or behavior) of V(t) 440 indicating the onset of instability, and generate a power diversion signal based on the comparison. The power diversion signal is provided to the power diverting system 450. The removal of power by the power diverting system 450 occurs in significantly less than the characteristic time corresponding to the thermal instability growth rate. The power diverting system 450 can also reapply power pulses only after a time required for the dissipation of the local increase in temperature (localized thermal "hot spots"). The voltage waveform can, in one embodiment, be utilized to sense return to normal (after dissipation of the local increase in temperature) conditions.

Figure 5B:
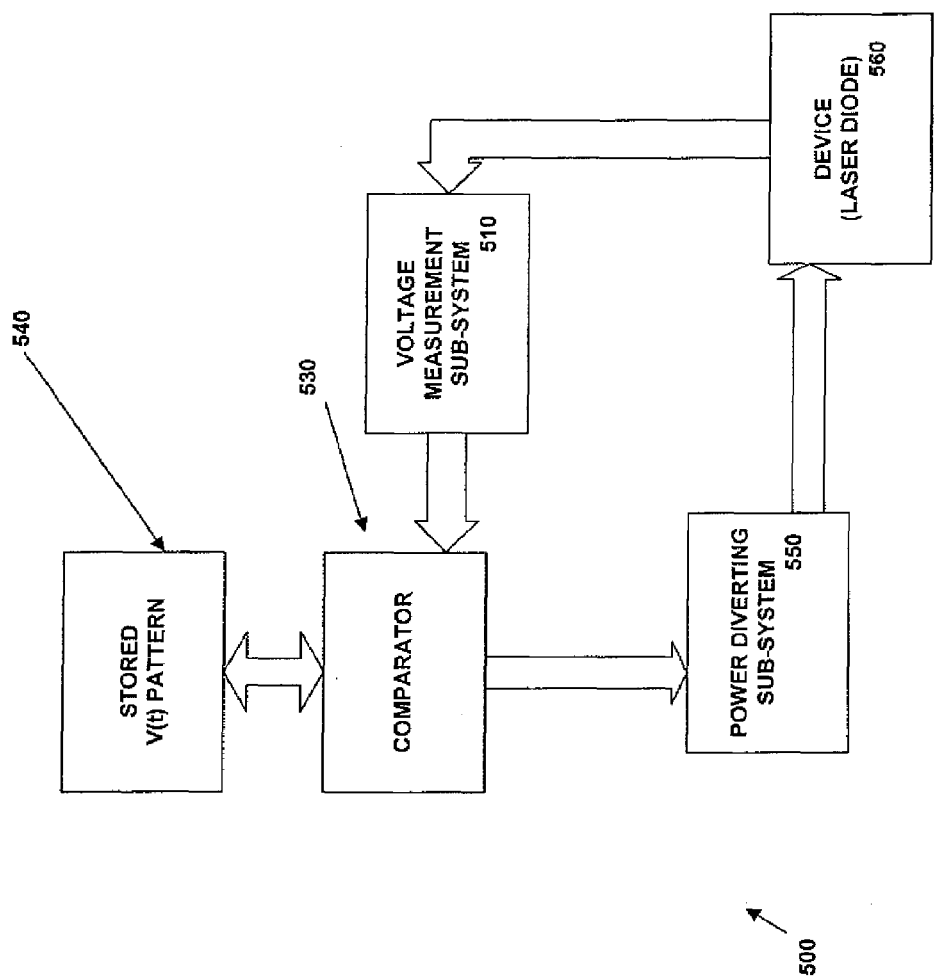
FIG. 5b is a schematic block diagram representation of another embodiment of the system of this invention.

FIG. 5b shows a schematic block diagram representation of another embodiment of a system 500 of this invention. Referring to FIG. 5b, a voltage measurement system 510 provides the laser diode voltage, V(t) as a function of time. In one embodiment, the laser diode voltage, V(t), is an analog signal. A reference signal 540 from a database of values of V(t) at substantially fixed currents indicating the onset of instability is compared, by means of a comparator 530, to the values of V(t) at the same substantially fixed currents generated by the measurement system 510. The comparator 530 can be an analog system or a hybrid analog/digital system. If the comparison indicates that the laser diode operation has departed from normal, a power diversion signal is provided to the power diverting system 550. The removal or reduction of power by the power diverting system 550 occurs in less than the characteristic time corresponding to the thermal instability growth rate. The power diverting system 550 can also reapply power pulses only after a time required for the dissipation of the local increase in temperature (localized thermal "hot spots"). The voltage waveform can, in one embodiment, be utilized to sense return to normal (after dissipation of the local increase in temperature) conditions.

Figure 5C:
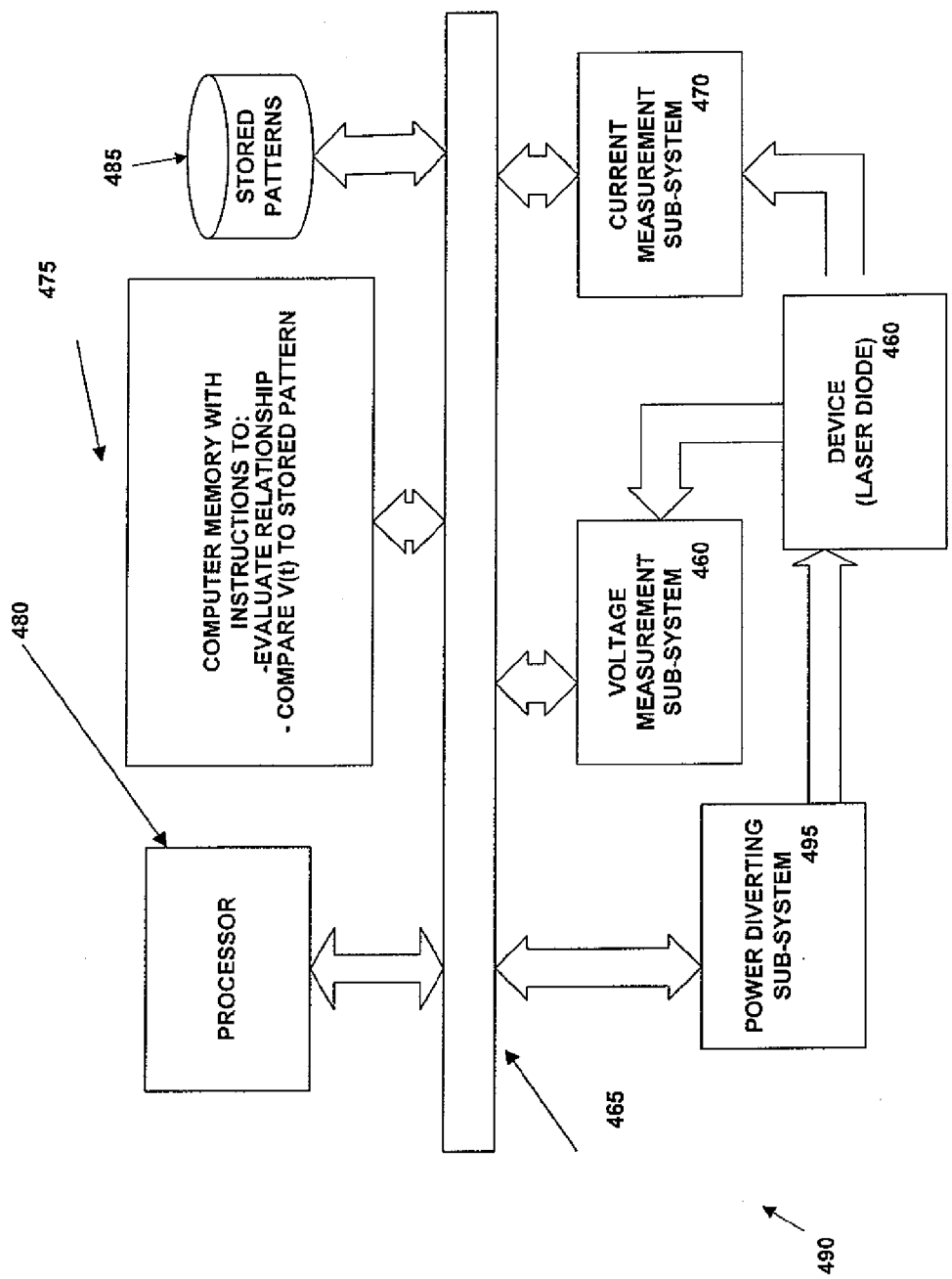
FIG. 5c is a schematic block diagram representation of yet another embodiment of the system of this invention.

FIG. 5c shows a schematic block diagram representation of yet another embodiment of a system 490 of this invention. Referring to FIG. 5c, a voltage measurement system 460 provides the laser diode voltage at discrete time intervals to an operable connection 465, such as a computer bus. A current measurement system 470 provides the laser diode current at discrete time intervals to the operable connection 465. A computer readable memory 475 has a computer readable code embodied therein to instruct a processor 480 to evaluate a relationship between the laser diode voltage and the laser diode current and compare the relationship to the data from a stored pattern (or behavior) 485 indicating the onset of instability, and generate a power diversion signal based on the comparison. The power diversion signal is provided to the power diverting system 495. The removal of power by the power diverting system 495 occurs in less than the characteristic time corresponding to the thermal instability growth rate. The power diverting system 495 can also reapply power pulses only after a time required for the dissipation of the local increase in temperature (localized thermal "hot spots"). The voltage waveform can, in one embodiment, be utilized to sense return to normal (after dissipation of the local increase in temperature) conditions.

Figure 5D:
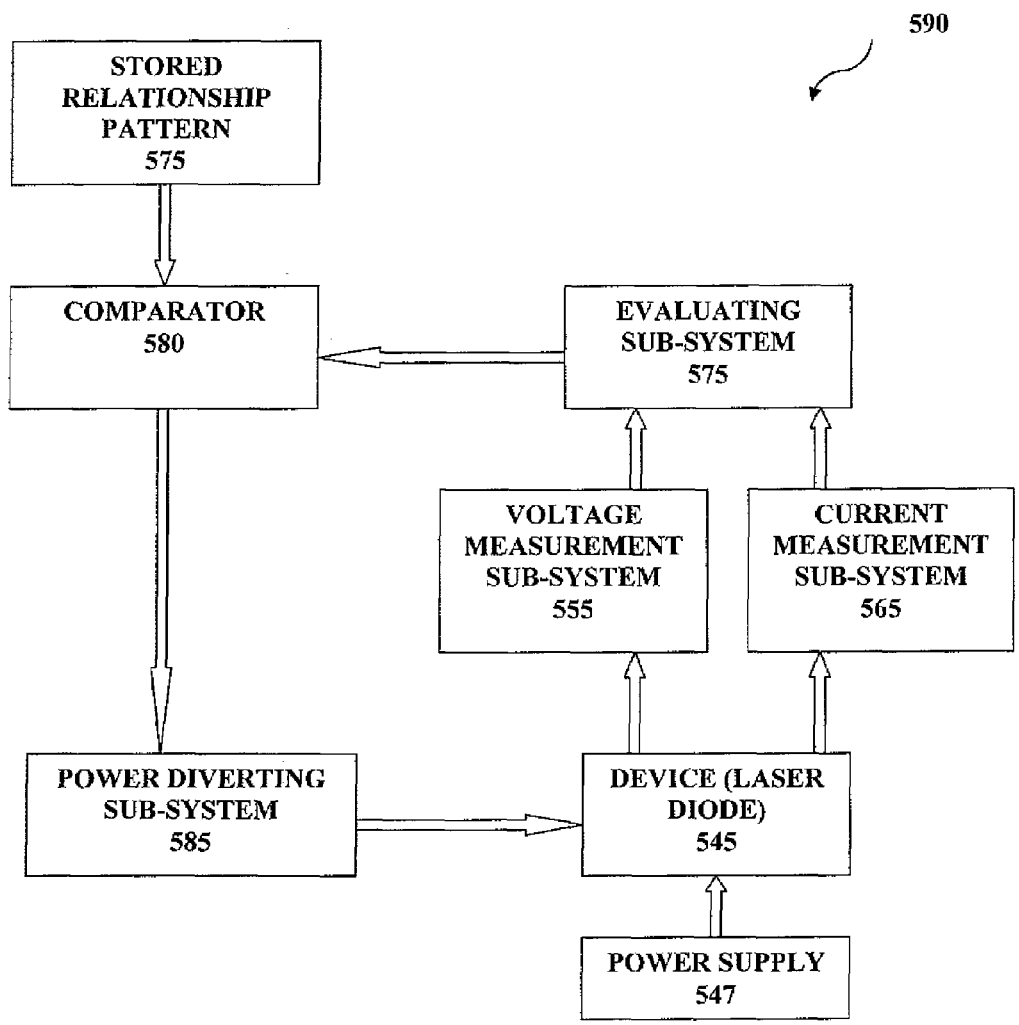
FIG. 5d is a schematic block diagram representation of a further embodiment of the system of this invention.

FIG. 5d shows a schematic block diagram representation of a further embodiment of a system 590 of this invention. Referring to FIG. 5d, a voltage measurement system 555 provides the laser diode voltage, V(t) as a function of time. In one embodiment, the laser diode voltage, V(t), is an analog signal. A current measurement system 565 provides the laser diode current, I(t), as a function of time. In one embodiment, the laser diode current, I(t), is an analog signal. An evaluating sub-system 570 receives the laser diode voltage, V(t), and the laser diode current, I(t), and evaluates a relationship between the laser diode voltage and the laser diode current, such as the impedance. The relationship, in one embodiment, is an analog signal. A reference signal 575 from a database of values of the relationship between the laser diode voltage and the laser diode current indicating the onset of instability is compared, by means of a comparator 580, to the values of the relationship generated by the evaluating sub-system 570. The comparator 580 can be an analog system or a hybrid analog/digital system. If the comparison indicates that the laser diode operation has departed from normal, a power diversion signal is provided to the power diverting system 585. The removal or reduction of power by the power diverting system 585 occurs in less than the characteristic time corresponding to the thermal instability growth rate. The power diverting system 585 can also reapply power pulses only after a time required for the dissipation of the local increase in temperature (localized thermal "hot spots"). The voltage waveform can, in one embodiment, be utilized to sense return to normal (after dissipation of the local increase in temperature) conditions.

The diode terminal voltage decreases from its equilibrium value as the transition is made from stable operation to unstable operation in a diode laser driven by a substantially constant current. Typically, this decrease is significant and can easily be detected from the diode or diode bar terminals. This decrease in device terminal (or junction) voltage accompanies the transition from stable to unstable operation (from unfilamented to filamented operation), and therefore is used in the above described embodiment as a signal to terminate or reduce power to the device as rapidly as possible. Similarly, applying a pulse to the diode terminals some time after terminating or reducing power to the device and measuring the diode terminal voltage can be used to determine whether the diode is ready to return to stable operation. Such probing may also be used to determine how much the current or pulse duration to the device must reduced to recover quasi-stable operation in pulsed operation.

Figure 6A:
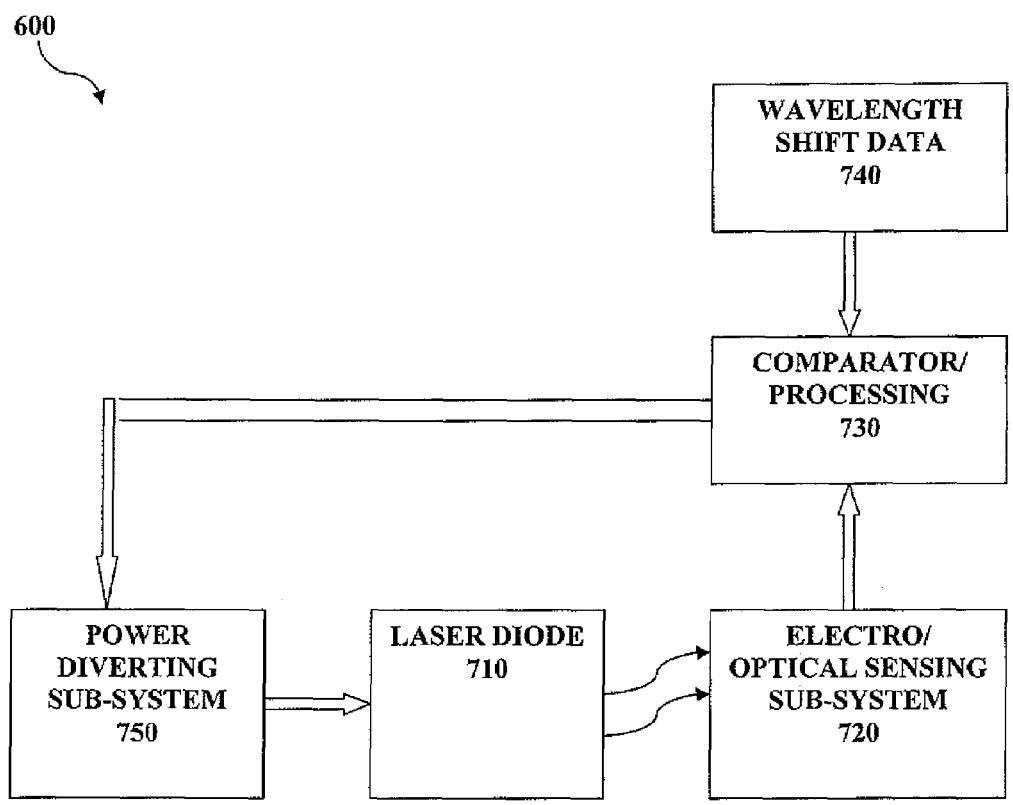
FIG. 6a is a schematic block diagram representation of yet another embodiment of the system of this invention.
Figure 9:
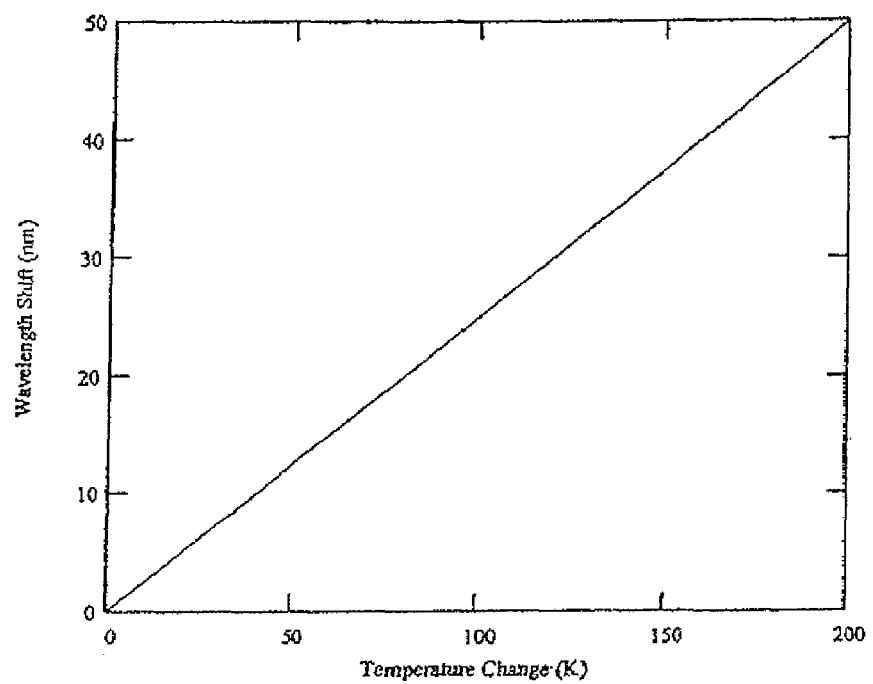
FIG. 9 is a schematic graphical representation of results of a calculation of wavelength shift associated with junction temperature.

FIG. 6a shows a schematic block diagram representation of yet another embodiment of a system 600 of this invention. Referring to FIG. 6a, an optical sensing device 720, such as, but not limited to, an optical system sampling a fraction of the total output of the laser diode (or junction device) or sensing the total back facet emission, senses the wavelengths of the laser diode output. One embodiment, but not limited to, of the optical system sampling a fraction of the output of the laser diode is an optical filter constructed with multi-layer dielectric coatings. The filter would be designed to pass wavelengths longer than the wavelengths associated with normal stable operation of the laser diode. For example, in a diode designed to radiate at 808 nm at normal operating temperature, most of the radiation is contained in a band of approximately a 2 nm width about 808 nm. The wavelength shift associated with a junction temperature rise locally of $\Delta T$ is shown in FIG. 9. If it was desired in one embodiment to detect a temperature rise of 50° K, then the filter would be designed to pass wavelengths above 820.5 nm, and to reject or absorb wavelengths below 820.5 nm. A small fraction of the light from the diode would be sampled (note that it is important to sample light from all parts of the output aperture of the diode, diode bar, or diode array), and sent to the filter. Any light with wavelength greater than a preselected value (820.5 nm in the example discussed above) then passes through the filter and is detected on a standard photodetector sensitive at wavelengths of the preselected value (820.5 nm in the example discussed above) and above.

Wavelength shift data (previously obtained) 740 indicating the onset of instability (anomalous device behavior and parameters) is compared to the output of the optical sensing device 720 by a comparison/processing system 730. In one embodiment the wavelength shift data (previously obtained)

740 provides a predetermined threshold. When the signal from the optical system sampling a fraction of the output reaches a certain threshold, the detector signal indicates that the laser diode operation has departed from normal. If the comparison indicates that the laser diode operation has departed from normal, a power diversion or reduction signal is provided to the power diverting system 750. The removal or reduction of power by the power diverting system 750 occurs in less than the characteristic time corresponding to the thermal instability growth rate. The power diverting system 750 can also reapply power pulses only after a time required for the dissipation of the local increase in temperature (localized thermal "hot spots"). The device terminal voltage waveform at a substantially fixed terminal current can, in one embodiment, be utilized to sense return to normal (after dissipation of the local increase in temperature) conditions.

Figure 6B:
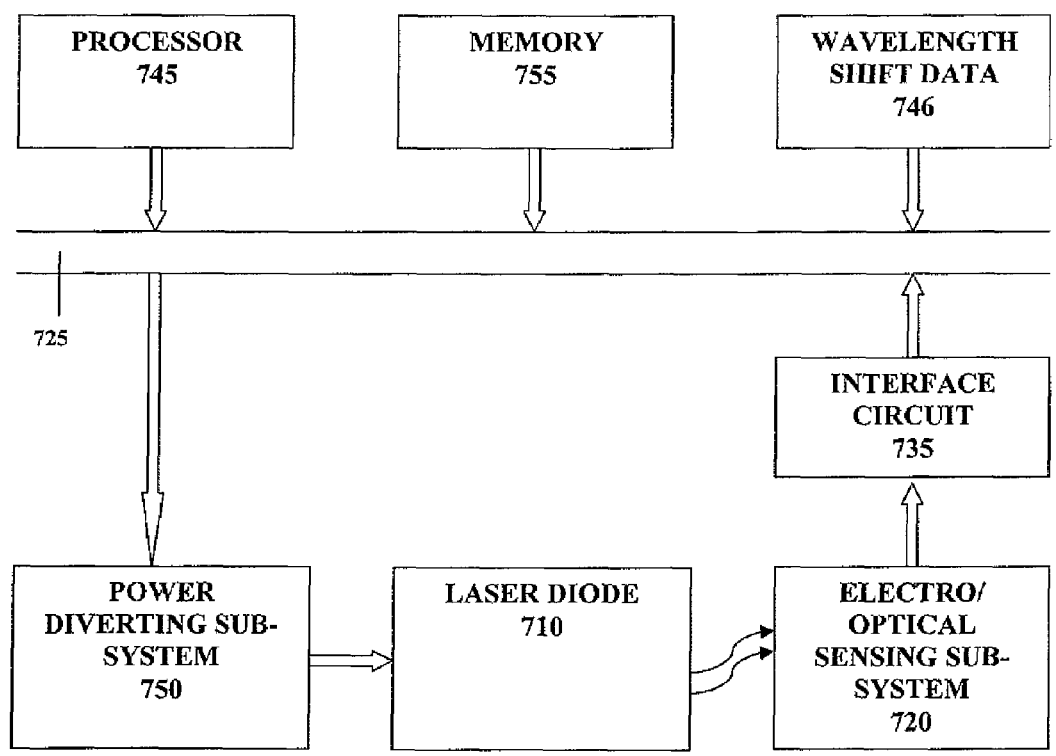

One embodiment of the comparison/processing system 730 is shown in FIG. 6b. Referring to FIG. 6b, the optical sensing device 720 provides laser diode wavelength data via an interface circuit 735 to an operable connection 725, such as a computer bus. A computer readable memory 755, also connected to the operable connection 725, has a computer readable code embodied therein to instruct a processor 745 to detect the initiation of anomalous behavior, and generate a power diversion/reduction signal. Upon receipt of the power diversion signal, the power diverting system 750 diverts, removes or reduces the power from laser diode 710.

In the embodiments of the system of this invention shown in FIGS. 5a-5d and 6a, 6b, the means for providing data indicating the onset of instability (anomalous behavior) are different depending on whether the comparator in the system operates as a mostly digital or mostly analog. For a mostly digital comparator, a pattern or value(s) indicative of anomalous behavior is stored in a computer readable memory. A pattern could be stored as a set of instructions that cause a processor to calculate the pattern. The pattern or data is provided or retrieved by the processor. For a mostly analog comparator, a value is stored as a reference quantity (voltage, for example) and pattern is obtained from an analog circuit (or a digital implementation and a D/A circuit). The reference value or pattern signal is provided as an input to the mostly analog comparator.

Similarly, in the embodiment of the system of this invention shown in FIGS. 5c and 5d, the means for providing values indicative of a preselected relationship between the device voltage and the device current are different depending on whether the comparator in the system operates as a mostly digital or mostly analog device. For a mostly digital comparator, a computer readable code stored in a computer readable memory provides instructions to a processor that allow the calculation of the relationship between the device voltage and the device current. For a mostly analog comparator, the signals indicative of the device voltage and the device current are provided to a circuit (a dedicated circuit or an equivalent to an analog computer circuit) that generates a signal indicative of the preselected relationship between the device voltage and the device current.

Figure 7:
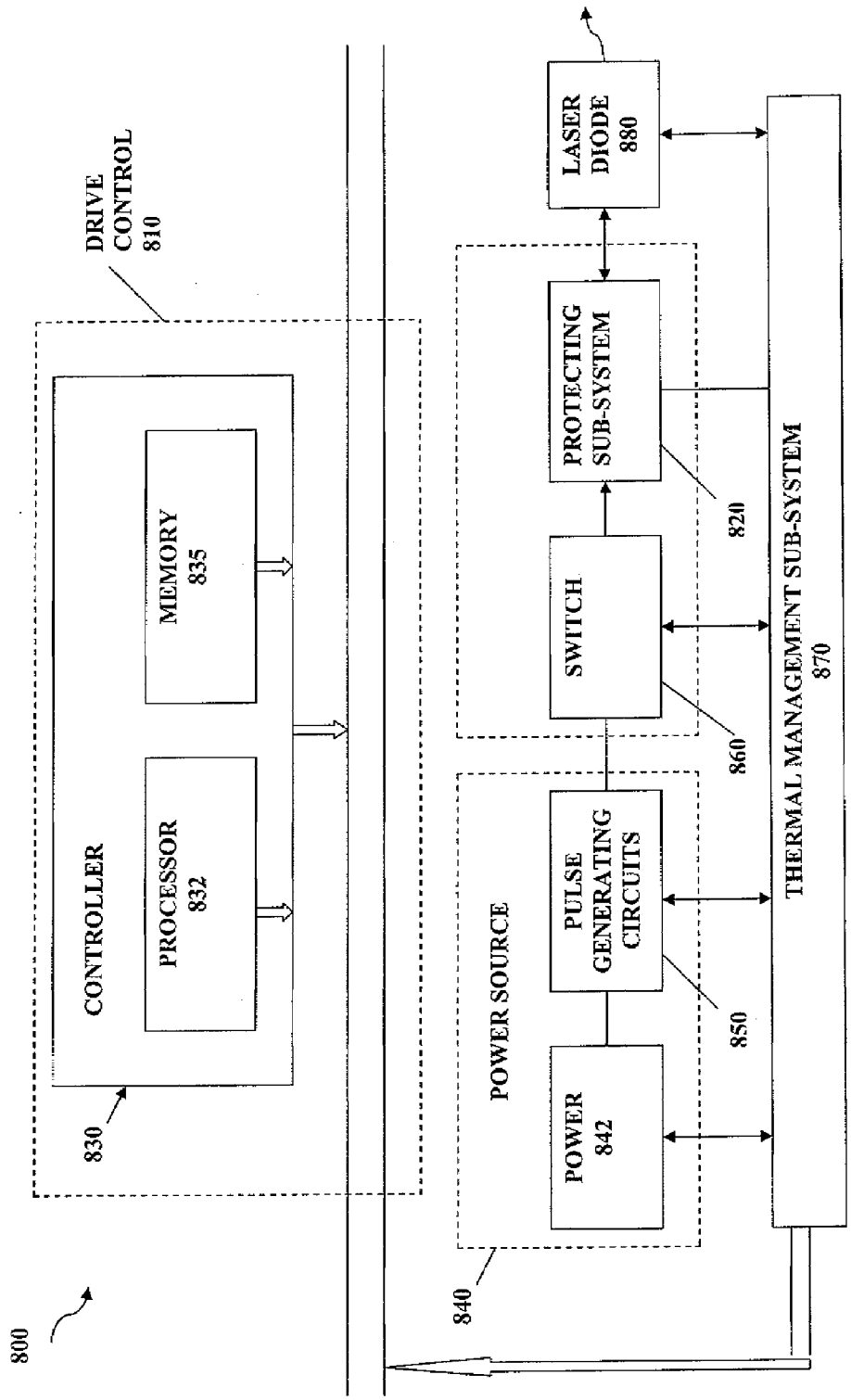
FIG. 7 is a schematic block diagram representation of one embodiment of a laser system incorporating the fault protection system of this invention.

A block diagram of one embodiment of a laser system 800 incorporating the fault protection system of this invention is shown in FIG. 7. Referring to FIG. 7, the laser diode drive control circuit 810 includes a laser protection sub-system 820 and a controller 830 (including a processor 832 and memory 835 in one embodiment, analog embodiments are possible but not shown) that implement an embodiment, such as that shown in FIG. 5a, 5b, 5c or 5d, of the device protection method of this invention. The power source sub-system 840, in one embodiment, includes pulse generating circuits 850 (also referred to as pulse forming), which in conjunction with switch 860 implement the predetermined waveform of this invention, such as that shown in FIG. 1. A thermal management system 870 controls the operating temperature of any of the components comprising circuit 800. The thermal management system 870 may be any combination of pipes, heat sinks, valves or other plumbing known for use with laser diode systems as well as electrical interface circuits to provide signals to the other sub-systems.

Figure 8:
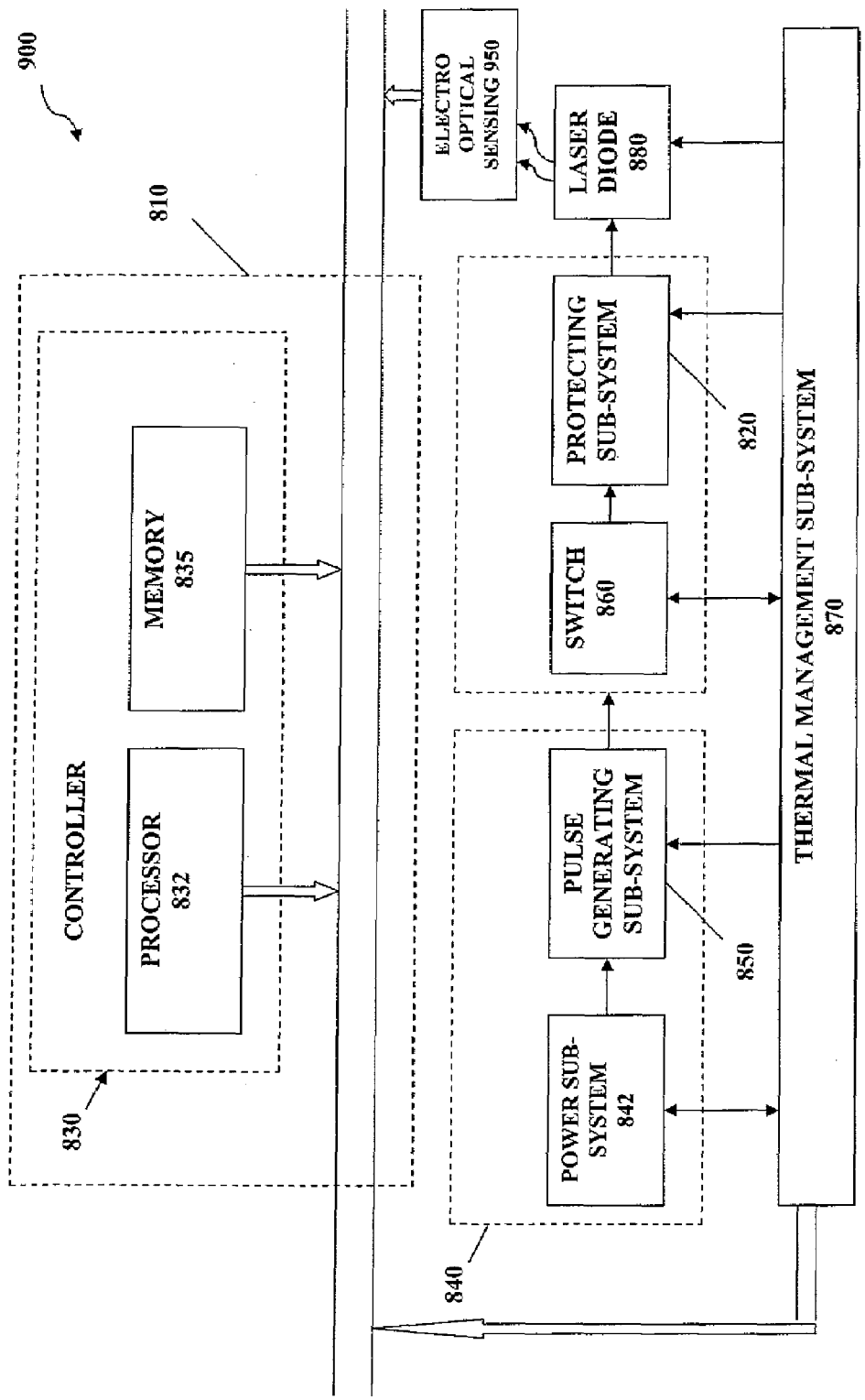
FIG. 8 is a schematic block diagram representation of another embodiment of the laser system incorporating the fault protection system of this invention.

A block diagram of another embodiment of a laser system 900 incorporating the fault protection system of this invention is shown in FIG. 8. Referring to FIG. 8, the laser diode drive control circuit 810 includes a laser protection sub-system 820 and a controller 830 (including a processor 832 and memory 835 in one embodiment, analog embodiments are possible but not shown), which in conjunction with a wavelength measurement sub-system 910 implement an embodiment, such as that shown in FIGS. 6a, or 6b, of the device protection method of this invention. The power source sub-system 840 and the thermal management system 870 perform the same function as in the laser system 800 of FIG. 7.

Exemplary, but not limited to, embodiments of the components of the laser system 800 are shown in U.S. Patent Application Publication No. US 2003/0039280 A1, corresponding to U.S. patent application Ser. No. 10/165,195, which is incorporated by reference herein.

In one embodiment, the protection sub-system 820 includes a snubber device located in parallel with laser diode 880. The snubber is configured such that when the snubber is operating in a high impedance state, substantially all of the current is directed to the laser diode 880, and when snubber is operating in a low impedance state, substantially all of current is directed through the snubber and away from laser diode 880. Preferably, for these embodiments, the snubber includes a high speed switch capable of being switched from the high impedance state to the low impedance state in a short interval of time. For example, the snubber may be a high-speed switching transistor, such as a MOSFET, or a bipolar transistor.

Alternatively, in some embodiments, protection sub-system 820 comprises a transient snubber device located in series with laser diode 880, which is capable of being selectively activated from a low impedance state to a high impedance state in response to a signal indicating that a threshold has been attained. In such embodiments, when the snubber device is operating in a low impedance state, substantially all of the current is directed to the laser diode 880, and when snubber device is operating in a high impedance state, the current is prohibited from reaching the laser diode 880. Preferably, for these embodiments, the snubber circuit comprises a high speed switch capable of being switched from a low impedance state to a high impedance state in a short interval of time. For example, the snubber may be a high-speed switching transistor, such as a MOSFET or a bipolar transistor.

In one embodiment, switch 860 can be any switch capable of switching a current and voltage signal. In some embodiments, switch 560 is capable of high-speed switching of high current and high voltage signals. For example, switch 860 may be an IGBT or a FET. In some embodiments, switch 860 is a gate commutated thyristor (GCT), available from ABB Semiconductor Ltd. of Lensburg, Switzerland.

One embodiment, but not limited to, of a current indicator device that generates an output signal indicative of the current passing to the junction device comprises a transformer coupled to an input of a comparator to generate a voltage indicative of the current flowing to the junction device.

An embodiment, but not limited to, of a voltage monitoring device that generates an output signal indicative of the voltage across the junction device comprises a comparator configured to monitor the voltage across a laser diode source, such as 460 in FIG. 5a or 560 in FIG. 5b. As described below, comparator 1036 becomes conductive in the event that the voltage across the laser diode source drops below a threshold voltage. The comparator may be any device having a conductivity dependent on a voltage input. For example, the comparator may be a transistor. In one embodiment, the comparator is a bipolar transistor having a switching rate of 1000 MHz. The comparator may, in some embodiments, be combination of devices such as a operational amplifier in combination with a transistor, where the operational amplifier monitors the voltage across the laser diode source and produces an output to the transistor, which becomes conductive upon receiving the operational amplifier output.

A signal indicative of the voltage and a signal indicative of the current may be used to produce a signal indicative of a relationship between the voltage and the current, such as the impedance of a laser diode.

An embodiment, but not limited to, of a power sub-system (842, FIG. 8) includes a prime power source, and a storage capacitor. The capacitor stores charge from prime power source to provide a selected current I to a device upon discharge. Driver circuits that use a voltage source to charge a capacitive element are commonly referred to as voltage-fed driver circuits. Another embodiment, but not limited to, of a power sub-system (842, FIG. 8) includes a prime power source and a charging circuit where the charging circuit is an inductive circuit or any other charging circuit suitable for this application. A further embodiment of a power sub-system (842, FIG. 8) includes a current source such as, but not limited to, those described in P. Horowitz and W. Hill, *The Art of Electronics*, ISBN 0521231515, pp. 59, 96-97, 231-232.

Embodiments of the pulse generating circuit 850 include, but are not limited to, a pulse forming network and/or a switch or a variety of switches that control the pulsing of the current to the laser diode source. A trigger or trigger signal controls a pulse frequency and duration of the pulse of current by controlling the switch. It is to be understood that the switch can be any switch capable of high-speed switching of high current and high voltage signals. For example, the switch may be a conventional laser diode driver circuit switch such as an IGBT or a FET. In some other embodiments the switch is a gate commutated thyristor (GCT).

In another embodiment of the present invention, methods for preventing spatially-nonuniform electric field concentrations (also referred to as electric field strength) substantially at the junction from reaching predetermined levels are utilized to mitigate the effects of higher junction current and temperature local to these concentrations, prevent accelerated aging, and prevent the triggering of the current instability described above. Methods to control electric field concentrations include, but are not limited to, specialized shaping of the highly conducting electrodes, tailoring of the dielectric constants and the electrical conductivity of the diode medium in the vicinity of the junction, and using other specialized electric field shaping techniques in the vicinity of the junction. Techniques to mitigate the electric field perturbations caused by the presence of the equilibrium electron-hole plasma can be developed by first calculating or measuring the electric field perturbations caused by the electron-hole plasma generated in the active junction region. Then specialized electric-field-shaping electrode structures or other field shaping methods can be employed to prevent localized electric field concentrations. These specialized electric field shaping structures may be most needed at the periphery of the junction.

Once a fault mode is detected with one of these approaches, the drive current to the diode is terminated within a thermal time constant or, preferably, in a time much less than a thermal time constant. Once the diode has had time to cool for a few thermal time constants (in the example above, for about 250 µs), the diode is once again ready to be powered by the electrical driver. However, the fact that thermal runaway was sensed on the previous pulse may mean either that the diode cooling circuits have malfunctioned or that the diode has aged to such a degree that the former stable operating point (V, I, T) is no longer stable. In the latter case, a new operating point for the diode must be selected.

A method of this invention is used to determine how the new operating point for the diode is selected. In one embodiment, previous data from such specific types of diodes is utilized to provide a look-up table to a processor in order to determine the new operating point, based on the old operating point. In another embodiment, the method is interactive in real time; the diode is pulsed for one pulse or a few pulses to gather the voltage/current or spectral data needed to select a new operating point. Each of these probe pulses might have lower current or shorter duration or both. The objective is to determine a new stable operating point for the diode, or at the very least, to determine an operating point that, though unstable, has a long enough onset time, that a new selection of micropulse duration can be made to continue quasi-stable operation. In this quasi-stable mode, the temperature of the diode junction increases locally during the pulse, but by an acceptable level. This new stable operating point can be detected with the same detection circuitry as was used to detect thermal runaway in the diode junction originally. Once the new operating point for the diode is selected in terms of current level, micropulse waveform, and level of acceptable temperature rise, diode operation can continue.

In some applications, it may be necessary to keep the total output from the individual diode, diode bar or diode array constant. In order to meet this requirement, it may be necessary to incorporate a spare individual diode, or diode bar which would be excited only when the power to the mainline individual diode, diode bar, or diode array is interrupted. In this manner, the total output power of the mainline diode, diode bar, or diode array and its spare is kept constant. Optical detection of the output of the individual diode, diode bar, or diode array is used together with a feedback loop which controls the input drive to the spare to insure constant total output power.

It should be noted that although in some of the embodiments presented above the methods and systems of this invention are described in terms of the device terminal voltage, in some embodiments the methods and systems can also be implemented in terms of the device junction voltage. The term "device voltage" as used herinafter refers to, but not limited to, device terminal voltage (also called terminal voltage) or device junction voltage (also called junction voltage).

Although the above embodiments have been described in reference to laser diode protection, the methods and systems of this invention can be utilized for protection of high current semiconductor devices with diode junctions.

Although the invention has been described with respect to various embodiments, it should be realized that this invention is also capable of a wide variety of further and other embodiments all within the spirit and scope of the appended claims.

Appendix A

The physics of the current filamentation instability can be explored by constructing a model for the diode that allows for non-uniform spatial current flow. A simple model consists of N+1 lumped elements connected in parallel as shown in FIG. A1. In this model, the spatial dependence of the current in the physical diode is modeled by the variation in current among the lumped elements. Current filamentation is observed as a concentration of current in one of the parallel lumped-element diodes. The number of individual diodes (N+1) in the model needed to simulate the entire length of the diode junction can be approximated by dividing the active junction width at the diode output by the height of the active region in the direction of the current flow. For current hogging calculations in laser diode bars, N+1 can be approximated as the number of individual diodes in the bar. In this model, we assume that N of the elements are identical, and that the N+1$^{st}$ element has a small perturbation in one of the material constants ($E_g(0)$, $\alpha$, $\beta$) or in an initial condition or conditions. The equations which describe this diode model are written below.

Electrical Properties of the Diode Elements:

$$V = \frac{kT}{e}\ln(i/i_s) + \frac{E_g(0)}{e} - \frac{\alpha}{e}\frac{T^2}{T+\beta} \quad \text{Unperturbed Element (1)}$$

$$\gamma V = \frac{kT_N}{e}\ln(i_N/i_s) + \frac{E_g(0)}{e} - \frac{\alpha}{e}\frac{T_N^2}{T_N+\beta} \quad \text{Perturbed Element (2)}$$

$$\sum_0^{N-1} i_i + i_N = I_o = \text{Constant Terminal Current} \quad (3)$$

where V is the terminal voltage, T is the temperature of elements 1 through N, $T_N$ is the temperature of element N+1, i is the current in elements 1 through N, $i_N$ is the current in element N+1, $E_g(0)$ is the bandgap at zero absolute temperature, and $\alpha$ and $\beta$ are constants which describe the temperature dependence of the bandgap. In these equations, $i/i_s$ and $i_N/i_s$ are assumed to be much larger than 1. The constants, $\alpha$ and $\beta$ as well as $E_g(0)$, can be determined from fits to measurements of electronic bandgap dependence on temperature. The parameter $\gamma$ is a measure of a local electric field (voltage) non-uniformity across the N+1$^{st}$ element.

Equations 1 and 2 describe approximately the relationships among the diode voltage, current, and temperature for each of the diode elements in the model. The last term on the right-hand-side of Eqs. 1 and 2 represent the temperature dependence of the bandgap. The current filamentation described here is a result of the decrease in bandgap with increasing temperature. Electric field non-uniformities are a result of variations in the dielectric constant and/or the electrical conductivity and/or the presence of the electron-hole plasma in the semiconducting material in the active region of the junction.

Thermal Properties of the Diode Elements:

$$\rho c_p v \frac{dT}{dt} = (1-\eta)(N+1)Vi - \frac{\pi^2 \kappa v}{h^2}(T-T_a) \quad \text{Unperturbed Element (4)}$$

$$\rho c_p v \frac{dT_N}{dt} = (1-\eta)(N+1)\gamma V i_N - \frac{\pi^2 \kappa v}{h^2}(T_N - T_a) \quad \text{Perturbed Element (5)}$$

where v=diode semiconductor volume=l·w·h, h is the height of the semiconductor junction (in the direction of current flow) and represents the distance between the highly conducting electrodes), l is the length of the diode in the lasing direction, $\kappa$=thermal conductivity, $\rho$=mass density, $c_p$=heat capacity, $\eta$=laser element electrical efficiency, and $T_a$=ambient temperature (cooled electrode temperature).

These equations describe the thermal balance in the individual diode elements that comprise the model. The increase in element temperature through the heat capacity term on the left hand side of this equation is set equal to the power left in the diode by non-radiative recombination of the charge carriers and other non radiative processes minus the power that leaves the diode by thermal conduction to the heat sunk electrodes.

Other, more detailed, embodiments of the diode model are possible. For example, there might also be division of the diode into lumped circuit elements in the dimension along the length of the diode in the lasing direction. In other embodiments of the model, each of the lumped elements might also be treated independently. However, the model described herein is adequate to describe many of the important phenomena leading to instability in these diodes.

This diode model is represented by 5 equations in 5 unknowns (i, $i_N$, T, $T_N$, and V). With a consistent set of initial conditions, these equations can be solved for the time dependence of the variables. These equations have been inserted into Mathcad (version 7) which has been used to solve these equations simultaneously. Solutions of these equations under specific operating conditions for a laser diode are provided below as one example of the current filamentation instability and as one example of current filamentation caused by non uniform electric field at a single junction location. These specific solutions relate to the operation of a GaAs-based laser diode, but are representative of laser diode operation in other materials and wavelengths. The laser efficiency is modeled in Eqs. 4 and 5 as a function of the diode current, and is characterized by an initial increase in efficiency as the current is raised and then a decrease in efficiency as the current is increased past the optimum efficiency point. The observed decrease in efficiency in commercially-available diodes at high currents is a measure of heating and perhaps filamentation at higher currents.

The solutions for the diode voltage V, currents i and $i_N$, and temperatures T and $T_N$, are given as a function of time for the conditions shown. Other parameters are also calculated as shown. Examples of a calculation of the equilibrium solution together with examples of stable and unstable operating points are given in FIGS. A2, A3 and A4 respectively. Small increases in the parameter $\gamma$ are used to demonstrate how non-uniformities in the local electric field near element N+1 can lead to (stable) changes in the local current and temperature of element N+1 with respect to other elements (FIGS. A2 and A3). Increasing current at a fixed value of $\gamma$ shows that the filamentation instability has a diode terminal current threshold (FIG. A3 and FIG. A4). In these examples, the operating parameters of the diode are kept fixed, except for changes in the total current to the diode terminal, I0, and the electric field enhancement factor, $\gamma$. In these examples, N is set equal to 75, corresponding, for example, to a junction width of 150 μm and an active junction height of approximately 2 μm.

In the example of FIG. A2, the total terminal current, I0, is set equal to 2200 mA and there is no electric field enhancement ($\gamma=0$) at the N+1$^{st}$ element. These assumptions lead to a stable operating condition for the diode that is characterized by equal current and temperature in all elements. This temperature rise away from ambient is approximately 3.6° K, which corresponds to a 0.9 nm shift in diode wavelength. The current in each of the elements is given by 2200 mA/(N+1) =28.9 mA. Note also that all elements of the laser diode radiate at their maximum efficiency of 50%. Also note that the temperature rise has created an approximate 2.35 mV decrease in diode terminal voltage. This stable operating regime in which all elements of the diode are operating at the same operating point is the desired operating regime.

In FIG. A3, the diode terminal current is reduced to 2000 mA and the electric field enhancement factor, $\gamma$, is made equal to 1.02: that is, the voltage of the N+1$^{st}$ element is made 2% higher than the voltage of the remaining elements. Under these conditions, the results shown in FIG. A3 show that diode operation is filamented but still stable. However, the equilibrium temperature of the perturbed N+1$^{st}$ element, Tn, increases to 344° K while the temperature of the remaining elements remains near 303° K. A commensurate increase in the current in this N+1$^{st}$ element, In, from 28.9 mA to 174 mA is also seen, while the current in the remaining 75 elements falls slightly to 24.4 mA. Finally, the decrease in terminal voltage is approximately 3.29 mV. Though the equilibrium temperature and current of the perturbed element increases above the previous equilibrium values, diode operation under these conditions is stable, but current and temperature filamentation are present.

In FIG. A4, the diode terminal current is increased back to 2200 mA and the electric field enhancement factor, $\gamma$, is maintained at 1.02. Under these conditions, diode operation is unstable and a filamentation instability develops. This instability is manifested as a large increase in the current and temperature of the perturbed N+1$^{st}$ element. In this case, the temperature of the perturbed element ultimately rises to 804° K, while the temperature of the unperturbed elements initially rises to approximately 303° K then falls back down to the ambient temperature, $T_a=300°$ K. As shown, ultimately all the terminal current (2200 mA) flows through the perturbed N+1$^{st}$ element, and none of the current flows through the remaining unperturbed elements. In this unstable case, the diode terminal voltage decreases by 153 mV. From the onset of the pulse to the point where the temperature of the perturbed element reaches 450° K, the diode terminal voltage decreases by 11.9 mV, and by the time the temperature of this element reaches 500° K, the diode terminal voltage decreases by 20.8 mV.

Once a value of $\gamma$ or $I_o$ is selected that makes the equilibrium unstable, all other parameters can be made the same, and the current $i_N$ and temperature $T_N$ of that element changes rapidly away from the equilibrium values. With a constant current driving the terminal of the diode, the current through the perturbed element can increase until essentially all the terminal current passes through that element, and the current in the other N elements are reduced to near zero. The temperature of the perturbed element also rises commensurately, and the temperature of the unperturbed elements falls to the temperature of the substrate, $T_a$. Or the current through the perturbed element can decrease until essentially none of the terminal current passes through that element, and the current in the other N elements all increase equally at the expense of this N+1$^{st}$ element. In this case, the temperature of the perturbed element decreases to the ambient temperature, $T_a$, while the temperature of the other elements rise.

The electrical driver powering the semiconductor junction can be operated as a current source, voltage source, or at any impedance levels between these limits. Similar analyses using similar equations can be performed for these other driver operating regimes, and similar stable and unstable operating conditions can be demonstrated to exist.

Equations 1-5 can also be linearized about an equilibrium solution, and solved analytically for the growth rates of the filamentation instability as a function of the equation parameters and the initial conditions.

With a small, positive perturbation in temperature and/or local electric field enhancement or in other parameters describing the perturbed element, solutions to these equations model the onset and temporal evolution of the filamentation instability. In this case, the instability is driven by the decrease in bandgap with increasing temperature. Solution of these linearized equations show the changes away from equilibrium in temperature and current of the perturbed element with time. The filamentation instability is manifested by the concentration, as time proceeds, of more and more of the current into the perturbed element, if that element is perturbed so that it is initially hotter than the unperturbed elements. If this perturbed element is made colder than the unperturbed elements, then the unperturbed elements gain in current and temperature at the expense of the unperturbed element (assuming constant current drive).

Filamentation instability can also be shown to result from small perturbations in any of the material constants as well, and from changes in the electric field at the junction (for example, at the physical ends of the junction). While some of the material constants in these equations are difficult to know precisely, this model can provide guidance as to the relative sensitivity of the filamentation growth rate and onset time to perturbations in the various constants, and so can assist in the design of diodes.

A stability analysis for Eqs. 1-5 can be made. The analysis begins by first calculating the equilibrium values of the currents, temperatures, and voltage. The equilibrium value of these parameters are determined by solving Eqs. 1-5, with the time derivative terms set to zero. The equilibrium value for these parameters are described by $i_o$, $i_{No}$, $T_o$, $T_{No}$, and $V_o$. For the special case where the material constants and initial conditions for the perturbed and unperturbed elements are the same ($i_o=i_{No}$, $T_o=T_{No}$), then the condition for a stable equilibrium is given in terms of $i_o$, $i_s$, $T_o$ and $\alpha$ and $\beta$ as:

$$\ln(i_o/i_s) > \frac{á}{k} \frac{T_o(T_o + 2â)}{(T_o + â)}$$

If this condition is not satisfied, then the equilibrium is unstable.

This model can also be used to describe the operation of a diode bar, and can be used to model current hogging instabilities among individual diodes in diode bars, or in any parallel combination of diodes.

What is claimed is:

1. A method for protecting semiconductor junction devices, the method comprising the steps of:
   a) detecting anomalous behavior of a semiconductor junction in a semiconductor junction device; said anomalous behavior comprising non uniformities/instabilities in local current density and/or temperature of the semiconductor junction; and,
   b) modifying junction input in order to quell the anomalous behavior;
   the step of detecting anomalous behavior not including detecting an external temperature of a semiconductor junction device.

2. The method of claim 1 wherein the step of detecting anomalous behavior comprises the step of:
detecting behavior of device voltage, the behavior capable of being indicative of anomalous junction behavior.

3. The method of claim 2 were in the step of detecting behavior of the device voltage comprises the steps of:
detecting the device voltage;
comparing the detected device voltage to predetermined device voltage behavior; and,
determining whether the junction behavior is anomalous.

4. The method of claim 1 further comprising the step of:
determining operating conditions for the device after the anomalous behavior substantially subsides.

5. The method of claim 1 further comprising the steps of:
applying an input pulse to terminals of the junction; and,
repeating steps a) and b).

6. The method of claim 5 further comprising the step of:
determining operating conditions for the device after repeating steps a) and b).

7. The method of claim 1 wherein the step of detecting anomalous behavior comprises the step of:
detecting behavior of a relationship between device voltage and device current, the behavior capable of being indicative of anomalous junction behavior.

8. The method of claim 7 where-in the step of detecting behavior of the relationship between device voltage and device current comprises the steps of:
detecting the device voltage;
detecting the device current;
evaluating a preselected relationship between device voltage and device current;
comparing behavior of the preselected relationship to predetermined behavior of the preselected relationship; and,
determining whether the junction behavior is anomalous.

9. The method of claim 1 wherein the step of detecting anomalous behavior comprises the step of:
detecting behavior of emitted wavelength indicative of anomalous behavior.

10. The method of claim 9 wherein the step of detecting behavior of the emitted wavelength comprises the steps of:
detecting the emitted wavelength;
comparing the detected emitted wavelength to predetermined emitted wavelength behavior; and,
determining whether the junction behavior is substantially anomalous.

11. A method for protecting semiconductor junction devices, the method comprising the step of:
providing at least one input pulse having a substantially high value over a predetermined time period; the predetermined time period being selected to be less than an onset time of anomalous behavior of the semiconductor junction.

12. The method of claim 11 wherein the at least one input pulse comprises at least two input pulses; another predetermined time period between an end of the predetermined time period and initiation of a substantially high value of a second input pulse being selected to be at least equal to a time required for anomalous behavior to substantially subside.

13. A system for protecting a semiconductor junction device, the system comprising:
a voltage measuring subsystem capable of providing values indicative of device terminal voltage; said values indicative of device terminal voltage being obtained at a predetermined device current;
means for providing at least one predetermined value indicative of anomalous behavior of the device terminal voltage;
a comparator subsystem capable of comparing the values indicative of device terminal voltage to the at least one predetermined value; an output of the comparator subsystem indicating whether anomalous behavior of the device terminal voltage is likely;
a power modifying subsystem capable of modifying input power to the semiconductor junction if the output of the comparator subsystem indicates that anomalous behavior of the device terminal voltage is likely.

14. The system of claim 13 wherein the comparator subsystem comprises:
at least one processor;
at least one computer readable memory having computer readable code embodied therein capable of causing the at least one processor to compare the values indicative of the device terminal voltage to the at least one predetermined value.

15. A system for protecting a semiconductor junction device, the system comprising:
a power input sub-system providing at least one input pulse having a substantially high value over a predetermined time period; the predetermined time period being selected to be less than an onset time of semiconductor junction anomalous behavior; said semiconductor junction anomalous behavior comprising non uniformities/instabilities in semiconductor junction local current density and/or temperature of the semiconductor junction.

16. The system of claim 15 wherein the power input subsystem is also capable of providing at least two input pulses; another predetermined time period between an end of the predetermined time period and initiation of a substantially high value of a second input pulse being selected to be at least equal to a time required for semiconductor junction anomalous behavior to substantially subside.

17. A system for protecting a semiconductor junction device, the system comprising:
a wavelength detecting subsystem capable of detecting at least one wavelength of electromagnetic radiation emanating from the semiconductor junction;
means for providing at least one predetermined wavelength value indicative of semiconductor junction device anomalous behavior;
a comparator subsystem capable of comparing the wavelength to the at least one predetermined wavelength value; an output of the comparator subsystem indicating whether semiconductor junction device anomalous behavior of the device is likely;
a power modifying subsystem capable of modifying input power to the semiconductor junction if the output of the comparator subsystem indicates that anomalous behavior of the device is likely.

18. The system of claim 17 wherein the comparator subsystem comprises:
at least one processor;
at least one computer readable memory having computer readable code embodied therein capable of causing the at least one processor to compare the wavelength to the at least one predetermined wavelength value.

19. A system for protecting a semiconductor junction device, the system comprising:
a power generating sub-system capable of providing input power;

a sensing sub-system capable of providing a sensing output indicative of whether semiconductor junction behavior is substantially anomalous;

a controllable power diverting circuit;

a controller capable of receiving the sensing output and of providing a control signal to the controllable power diverting circuit;

at least one input pulse having a substantially high value over a predetermined time period, the predetermined time period being selected to be at most substantially equal to an onset time for the semiconductor junction anomalous behavior being provided to a semiconductor junction device sub-system.

20. The system of claim 19 wherein at least two input pulses, another predetermined time period between an end of the predetermined time period and initiation of a substantially high value of a second input pulse being selected to be at least equal to a time required for anomalous behavior to substantially subside, can be provided to a laser diode sub-system.

21. The system of claim 19 wherein diagnostic power pulses can be provided to a laser diode sub-system; the diagnostic power pulses being provided after the anomalous behavior has substantially subsided.

22. The system of claim 19 wherein the controllable power diverting circuit comprises a switch.

23. The system of claim 19 wherein the sensing sub-system comprises a voltage measuring subsystem capable of providing values indicative of device voltage.

24. The system of claim 23 wherein the controller comprises:

means for providing at least one predetermined value indicative of anomalous behavior of the device voltage;

a comparator subsystem capable of comparing the values indicative of device voltage to the at least one predetermined value.

25. The system of claim 19 wherein the sensing sub-system comprises a wavelength detecting subsystem capable of detecting at least one wavelength of electromagnetic radiation emanating from the semiconductor junction.

26. The system of claim 25 wherein the controller comprises:

means for providing at least one predetermined wavelength value indicative of semiconductor junction anomalous behavior;

a comparator subsystem capable of comparing the wavelength to the at least one predetermined wavelength value.

27. A system for protecting a semiconductor junction device, the system comprising:

a voltage measuring subsystem capable of providing values indicative of device voltage;

a current measuring subsystem capable of providing values indicative of device current;

means for providing values indicative of a preselected relationship between the device voltage and the device current;

means for providing at least one predetermined value indicative of anomalous behavior of the preselected relationship between the device voltage and the device current;

a comparator subsystem capable of comparing the values indicative of a preselected relationship between the device voltage and the device current to the at least one predetermined value; an output of the comparator subsystem indicating whether anomalous behavior of the device voltage is likely;

a power modifying subsystem capable of modifying input power to the semiconductor junction if the output of the comparator subsystem indicates that anomalous behavior of the device voltage is likely.

28. The system of claim 27 wherein the comparator subsystem comprises:

at least one processor;

at least one computer readable memory having computer readable code embodied therein capable of causing the at least one processor to compare the values indicative of a preselected relationship between the device voltage and the device current to the at least one predetermined value.

29. A method for protecting semiconductor junction devices, the method comprising the steps of:

a) detecting a device terminal voltage;

b) comparing the detected device terminal voltage to predetermined device terminal voltage behavior;

c) determining, from the comparison, whether device terminal behavior is anomalous; said anomalous behavior of the device terminal voltage resulting from semiconductor junction anomalous behavior; said semiconductor junction anomalous behavior comprising non uniformities/instabilities in semiconductor junction local current density and/or temperature;

d) modifying semiconductor junction device input in order to quell the anomalous behavior, if anomalous behavior is present;

e) applying an input pulse to terminals of the device; and, f) repeating steps a) and d).

30. A method for protecting semiconductor junction devices, the method comprising the steps of:

a) detecting a device voltage;

b) detecting a device current;

c) evaluating a preselected relationship between device voltage and device current;

d) comparing behavior of the preselected relationship to predetermined behavior of the preselected relationship;

e) determining, from the comparison, whether device behavior is anomalous; said anomalous device behavior resulting from semiconductor junction anomalous behavior; said semiconductor junction anomalous behavior comprising non uniformities/instabilities in semiconductor junction local current density and/or temperature;

f) modifying device input in order to quell the anomalous behavior, if anomalous behavior is present;

g) applying an input pulse to terminals of the device; and, h) repeating steps a) and f).

31. A method for protecting semiconductor junction devices, the method comprising the steps of:

a) detecting at least one emitted wavelength;

b) comparing the at least one detected emitted wavelength to predetermined emitted wavelength behavior;

c) determining whether device behavior is anomalous; said anomalous device behavior resulting from semiconductor junction anomalous behavior; said semiconductor junction anomalous behavior comprising non uniformities/instabilities in semiconductor junction local current density and/or temperature;

d) modifying device input in order to quell the anomalous behavior, if anomalous behavior is present;

e) applying an input pulse to terminals of the device; and, f) repeating steps a) and d).

* * * * *